United States Patent
Luo et al.

(10) Patent No.: US 12,315,541 B2
(45) Date of Patent: May 27, 2025

(54) MAGNETORESISTIVE MEMORY DEVICE AND MANUFACTURING METHOD THEREOF

(71) Applicants: TAIWAN SEMICONDUCTOR MANUFACTURING CO., LTD., Hsinchu (TW); NATIONAL TAIWAN UNIVERSITY, Taipei (TW)

(72) Inventors: Zong-You Luo, Taoyuan (TW); Ya-Jui Tsou, Taichung (TW); Chee-Wee Liu, Taipei (TW); Shao-Yu Lin, Taichung (TW); Liang-Chor Chung, Hsinchu County (TW); Chih-Lin Wang, Hsinchu County (TW)

(73) Assignees: TAIWAN SEMICONDUCTOR MANUFACTURING CO., LTD., Hsinchu (TW); NATIONAL TAIWAN UNIVERSITY, Taipei (TW)

( * ) Notice: Subject to any disclaimer, the term of this patent is extended or adjusted under 35 U.S.C. 154(b) by 0 days.

(21) Appl. No.: 18/352,872

(22) Filed: Jul. 14, 2023

(65) Prior Publication Data

US 2023/0360686 A1    Nov. 9, 2023

Related U.S. Application Data

(60) Continuation of application No. 17/871,983, filed on Jul. 25, 2022, now Pat. No. 11,749,328, which is a division of application No. 16/572,329, filed on Sep. 16, 2019, now Pat. No. 11,410,714.

(51) Int. Cl.
G11C 11/16 (2006.01)
H10B 61/00 (2023.01)
H10N 50/01 (2023.01)
H10N 50/10 (2023.01)
H10N 50/80 (2023.01)
H10N 50/85 (2023.01)

(52) U.S. Cl.
CPC ............ G11C 11/161 (2013.01); H10B 61/00 (2023.02); H10B 61/20 (2023.02); H10N 50/01 (2023.02); H10N 50/10 (2023.02); H10N 50/80 (2023.02); H10N 50/85 (2023.02)

(58) Field of Classification Search
CPC ..... H01L 27/222; H01L 27/224; H10B 61/00; H10B 61/10
See application file for complete search history.

(56) References Cited

U.S. PATENT DOCUMENTS

| | | |
|---|---|---|
| 7,405,958 B2 | 7/2008 | Okazawa |
| 7,755,093 B2 | 7/2010 | Ohara |
| 8,143,146 B2 | 3/2012 | Kiyotoshi |
| 8,198,618 B2 | 6/2012 | Mikawa |

(Continued)

FOREIGN PATENT DOCUMENTS

| | | |
|---|---|---|
| EP | 3664094 A1 | 6/2020 |
| WO | 2019066828 A1 | 4/2019 |

*Primary Examiner* — Victoria K. Hall
(74) *Attorney, Agent, or Firm* — Maschoff Brennan

(57) ABSTRACT

A method includes forming bottom conductive lines over a wafer. A first magnetic tunnel junction (MTJ) stack is formed over the bottom conductive lines. Middle conductive lines are formed over the first MTJ stack. A second MTJ stack is formed over the middle conductive lines. Top conductive lines are formed over the second MTJ stack.

20 Claims, 37 Drawing Sheets

(56) References Cited

U.S. PATENT DOCUMENTS

| | | |
|---|---|---|
| 8,411,494 B2 | 4/2013 | Shukh |
| 8,551,852 B2 | 10/2013 | Aoyama |
| 8,786,040 B2 | 7/2014 | Doyle |
| 9,087,576 B1 | 7/2015 | Herner |
| 9,142,762 B1 | 9/2015 | Li |
| 9,496,486 B2 | 11/2016 | Doyle |
| 9,502,466 B1 | 11/2016 | Chuang |
| 9,570,670 B2 | 2/2017 | Park |
| 9,865,649 B2 | 1/2018 | Tan |
| 10,026,779 B2 | 7/2018 | Sanuki |
| 10,128,314 B2 | 11/2018 | Boivin |
| 10,256,190 B2 | 4/2019 | Lee |
| 10,290,679 B1 | 5/2019 | Bhushan |
| 10,700,125 B2* | 6/2020 | Chiang ............... H10B 61/10 |
| 10,784,440 B2 | 9/2020 | Tseng |
| 10,840,439 B2 | 11/2020 | Pinarbasi |
| 10,886,330 B2 | 1/2021 | Pinarbasi |
| 11,107,859 B2 | 8/2021 | Chiang |
| 11,189,782 B2 | 11/2021 | Doris |
| 11,227,645 B2 | 1/2022 | Sakhare |
| 11,233,090 B2 | 1/2022 | Mahji |
| 11,410,714 B2* | 8/2022 | Luo .................... H10B 61/00 |
| 11,417,378 B2 | 8/2022 | Endoh |
| 11,672,181 B2* | 6/2023 | Tseng .................. A61K 8/731 |
| | | 365/158 |
| 11,749,328 B2* | 9/2023 | Luo .................... H10N 50/85 |
| | | 257/421 |
| 2005/0042825 A1 | 2/2005 | Kitamura |
| 2007/0166840 A1 | 7/2007 | Assefa |
| 2008/0105878 A1 | 5/2008 | Ohara |
| 2009/0294751 A1* | 12/2009 | Kiyotoshi ........... H10B 63/20 |
| | | 257/4 |
| 2010/0019297 A1 | 1/2010 | Hwang |
| 2014/0175583 A1 | 6/2014 | Doyle |
| 2015/0179244 A1 | 6/2015 | Seo |
| 2015/0280112 A1 | 10/2015 | Li |
| 2016/0218145 A1 | 7/2016 | Han |
| 2017/0069684 A1 | 3/2017 | Suh |
| 2017/0244026 A1 | 8/2017 | Wu |
| 2017/0256584 A1* | 9/2017 | Sanuki ................. H10N 50/01 |
| 2017/0256706 A1 | 9/2017 | Toko |
| 2019/0088864 A1 | 3/2019 | Cho |
| 2019/0148625 A1 | 5/2019 | Tseng |
| 2019/0206936 A1 | 7/2019 | Pinarbasi |
| 2019/0386203 A1 | 12/2019 | Gosavi |
| 2020/0075843 A1* | 3/2020 | Nagel .................. H10B 61/22 |
| 2020/0098976 A1 | 3/2020 | Jacob |
| 2020/0098977 A1 | 3/2020 | Kim |
| 2020/0098978 A1 | 3/2020 | Liao |
| 2020/0105829 A1 | 4/2020 | Boone |
| 2020/0105830 A1* | 4/2020 | Chiang ................ H10N 50/10 |
| 2020/0235162 A1* | 7/2020 | Majhi .................. H10B 63/80 |
| 2020/0403032 A1 | 12/2020 | Dutta |
| 2021/0043683 A1 | 2/2021 | Chiang |
| 2021/0043827 A1 | 2/2021 | Hashemi |
| 2021/0066126 A1 | 3/2021 | Ramanathan |
| 2021/0066578 A1 | 3/2021 | Doris |
| 2021/0110857 A1 | 4/2021 | Endoh |
| 2021/0296573 A1 | 9/2021 | Manfrini |
| 2021/0313510 A1 | 10/2021 | Tseng |
| 2022/0020920 A1 | 1/2022 | Chen |
| 2022/0044717 A1 | 2/2022 | Huang |
| 2022/0052255 A1 | 2/2022 | Yang |
| 2022/0069201 A1 | 3/2022 | Yin |
| 2022/0069204 A1 | 3/2022 | Ko |

\* cited by examiner

P

MAGNETORESISTIVE MEMORY DEVICE AND MANUFACTURING METHOD THEREOF

CROSS-REFERENCE TO RELATED APPLICATION

The present application is a Continuation application of U.S. application Ser. No. 17/871,983, filed on Jul. 25, 2022, now U.S. Pat. No. 11,749,328, issued on Sep. 5, 2023, which is a Divisional application of U.S. application Ser. No. 16/572,329, filed on Sep. 16, 2019, now U.S. Pat. No. 11,410,714, issued on Aug. 9, 2022, which are herein incorporated by references.

BACKGROUND

In the semiconductor integrated circuit (IC) industry, technological advances in IC materials and design have produced generations of ICs where each generation has smaller and more complex circuits than the previous generation. In the course of IC evolution, functional density (i.e., the number of interconnected devices per chip area) has generally increased as a result of decreasing minimum feature size or geometry sizes (i.e., the smallest component (or line) that can be created using a fabrication process). Such scaling down has also increased the complexity of IC processing and manufacturing.

One type of feature that may be part of an integrated circuit is a Magnetic Tunnel Junction (MTJ). An MTJ is a device that changes its resistive state based on the state of magnetic materials within the device. The MTJ involves spin electronics, which combines semiconductor technology and magnetic materials and devices. The spin polarization of electrons, rather than the charge of the electrons, is used to indicate the state of "1" or "0."

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
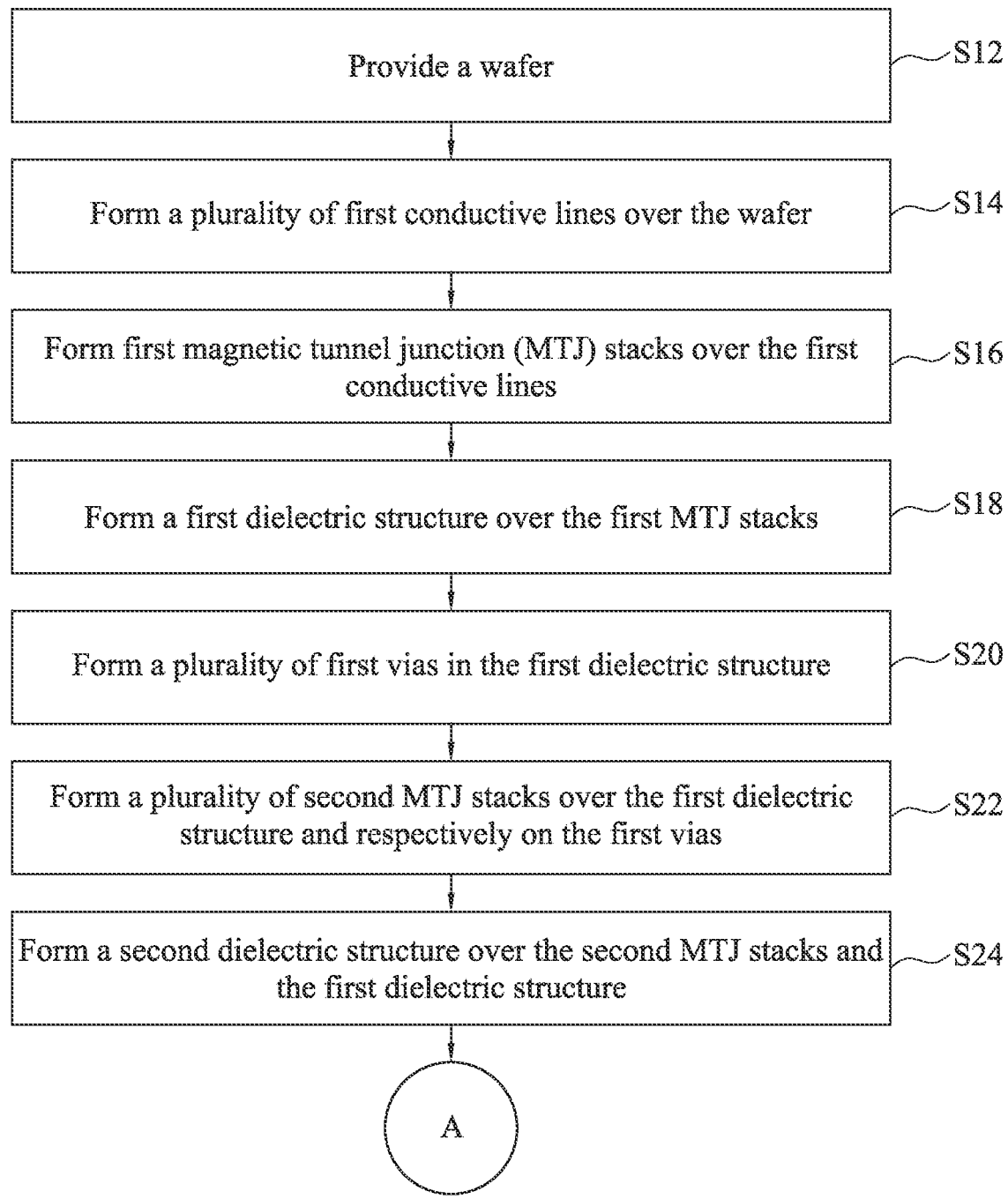
FIGS. 1A and 1B are a flowchart of a method for manufacturing a memory device according to aspects of the present disclosure in various embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, "around", "about", "approximately", or "substantially" shall generally mean within 20 percent, or within 10 percent, or within 5 percent of a given value or range. Numerical quantities given herein are approximate, meaning that the term "around", "about", "approximately", or "substantially" can be inferred if not expressly stated.

The embodiments of this disclosure relate to integrated memory fabrications and more specifically to magnetoresistive memory formations by forming a memory array with different leveled magnetic tunnel junctions (MTJs). Because of the different leveled magnetic tunnel junctions, an integrated memory device with high density can be formed. Further, the area of back-end-of-line (BEOL) may be saved.

The memory device may be used in spin-transfer torque (STT) MRAM or other suitable memories.

Figure 1B:
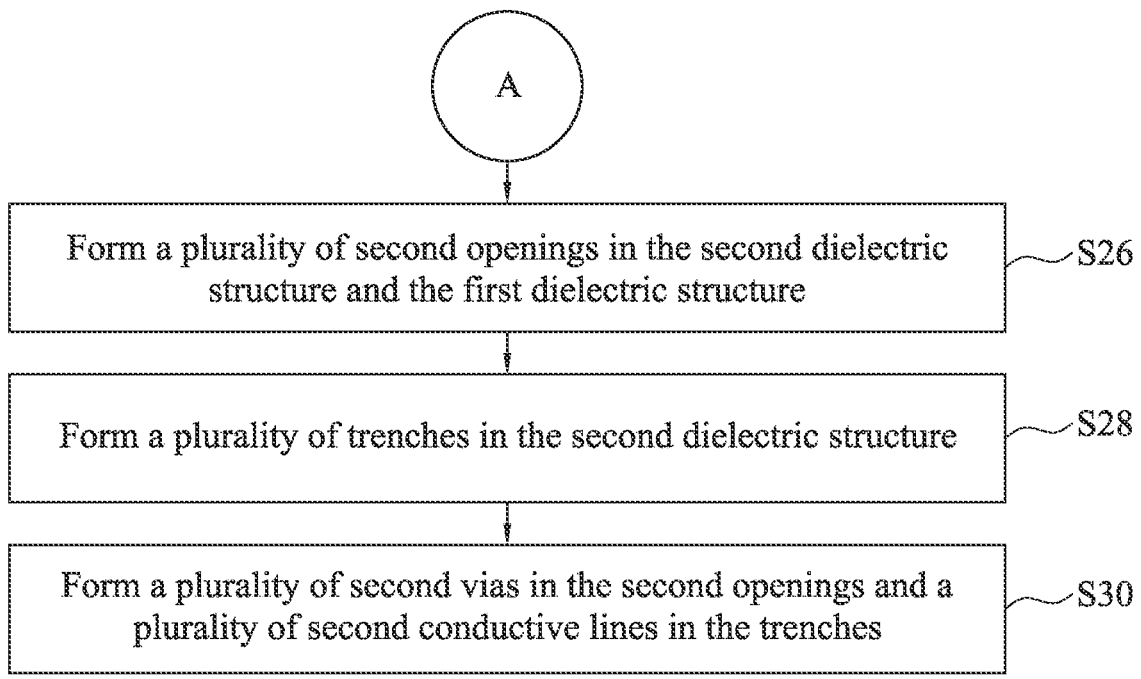

FIGS. 1A and 1B are a flowchart of a method M10 for manufacturing a memory device according to aspects of the present disclosure in various embodiments. Various operations of the method M10 are discussed in association with diagrams FIGS. 2A-14B, where FIGS. 2A, 3A, 4A, 5A, 6A, 7A, 8A, 9A, 10A, 11A, 12A, 13A, and 14A respectively illustrate top views of the semiconductor device at various stages in accordance with some embodiments of the present disclosure, and FIGS. 2B, 3B, 4B, 5B, 6B, 7B, 8B, 9B, 10B, 11B, 12B, 13B, and 14B illustrate cross-sectional views of lines B-B respectively illustrated in FIGS. 2A, 3A, 4A, 5A, 6A, 7A, 8A, 9A, 10A, 11A, 12A, 13A, and 14A. Throughout the various views and illustrative embodiments, like reference numbers are used to designate like elements.

Figure 2A:
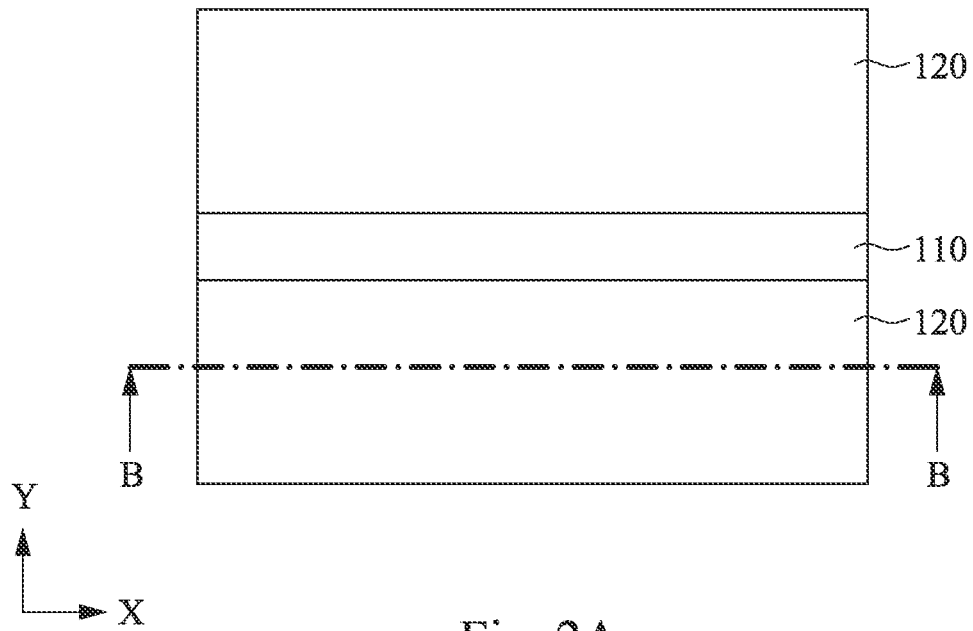
FIGS. 2A, 3A, 4A, 5A, 6A, 7A, 8A, 9A, 10A, 11A, 12A, 13A, and 14A respectively illustrate top views of the semiconductor device at various stages in accordance with some embodiments of the present disclosure.
Figure 2B:
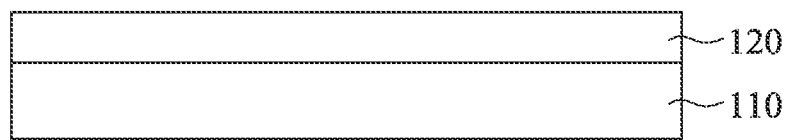
FIGS. 2B, 3B, 4B, 5B, 6B, 7B, 8B, 9B, 10B, 11B, 12B, 13B, and 14B illustrate cross-sectional views of lines B-B respectively illustrated in FIGS. 2A, 3A, 4A, 5A, 6A, 7A, 8A, 9A, 10A, 11A, 12A, 13A, and 14A.

In operation S12 of method M10 in FIG. 1A, a wafer 110 is provided, as shown in FIGS. 2A and 2B. In some embodiments, the wafer 110 is a substrate. In some other embodiments, the wafer 110 includes a substrate and a logic circuit over the substrate. The substrate may be a silicon substrate. Alternatively, the substrate may include another elementary semiconductor, such as germanium; a compound semiconductor including silicon carbide; an alloy semiconductor including silicon germanium; or combinations thereof. In some embodiments, the substrate is a semiconductor on insulator (SOI) substrate. The substrate may include doped regions, such as p-wells and n-wells. In some embodiments, the wafer 110 is a workpiece that includes the substrate and various features formed in and over and attached to the substrate. In some embodiments, the logic circuit includes transistors formed by transistor fabrication processes and may be a planar transistor, such as polysilicon gate transistors or high-k metal gate transistors, or a multi-gate transistor, such as fin field effect transistors.

In operation S14 of method M10 in FIG. 1A, a plurality of bottom conductive lines 120 are formed over the wafer 110, as shown in FIGS. 2A and 2B. In some embodiments, the bottom conductive lines 120 are formed of copper or copper alloys. In some other embodiments, the bottom conductive lines 120 may be formed of conductive materials such as cobalt, aluminum, tungsten, carbon, Ru, Ra, TaN, or other suitable materials. In still some other embodiments, the bottom conductive lines 120 may be a bilayer structure (e.g., a TaN layer and a TiN layer formed on the TaN layer). In some embodiments, a blanket conductive layer may be formed on the wafer 110 in advance, and then the blanket conductive layer is patterned to be a plurality of the bottom conductive lines 120. In FIG. 2A, the bottom conductive lines 120 extend in the X direction. In some embodiments, the bottom conductive lines 120 has a thickness in a range from about 0.1 nm to about 1000 nm, and may have a width in a range of about 0.1 nm to about 1000 nm, e.g., about 30 nm.

Figure 3A:
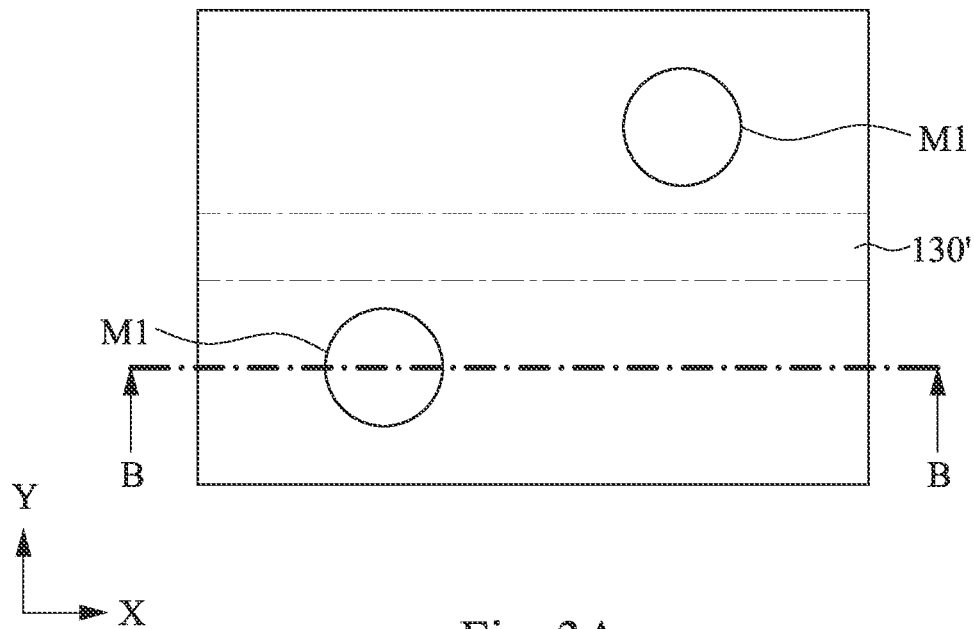
Figure 3B:
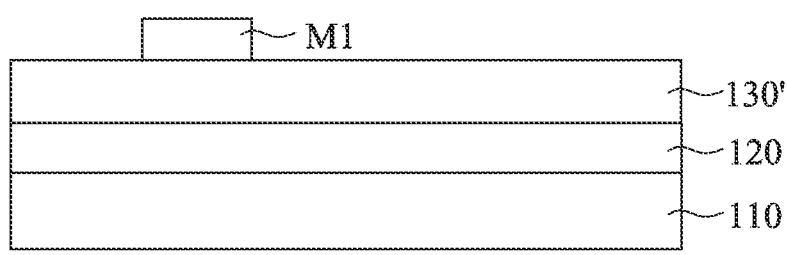
Figure 15A:
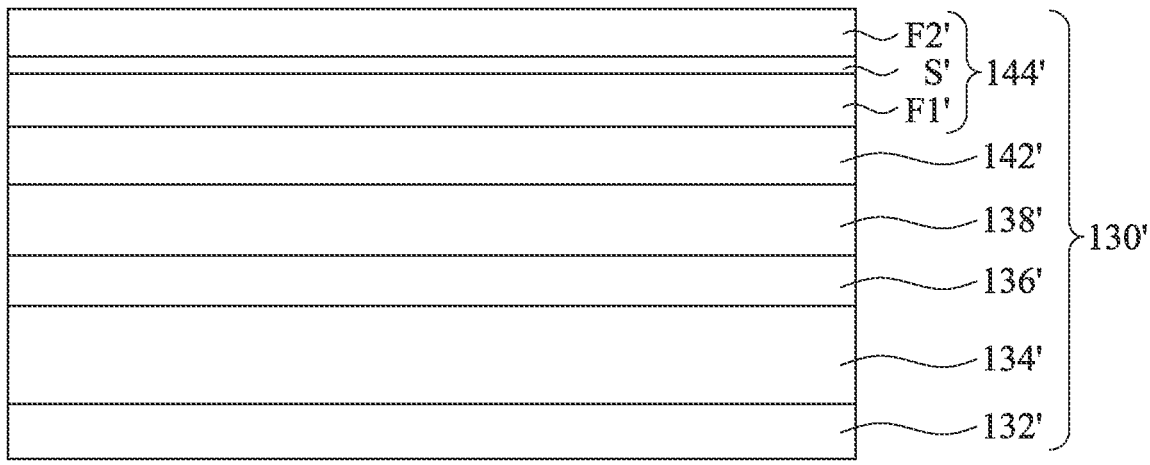
FIG. 15A is an enlarged cross-sectional view of the first MTJ structure in FIG. 3B.

In operation S16 of method M10 in FIG. 1A, a plurality of first MTJ stacks 130 are formed over the bottom conductive lines 120, as shown in FIGS. 3A, 3B, 4A, and 4B. Reference is made to FIGS. 3A, 3B, and 15A, where FIG. 15A is an enlarged cross-sectional view of the first MTJ structure 130' in FIG. 3B. A seed layer 132' is formed on the bottom conductive lines 120 and the wafer 110. The seed layer 132' may be made of a variety of conductive materials such as metal or metal alloy materials. For example, the seed layer 132' may be made of platinum (Pt), ruthenium (Ru), copper (Cu), tungsten (W), aluminum (Al), titanium (Ti), tantalum (Ta), or other suitable conductive material(s) or layered combination thereof. The seed layer 132' may be deposited by a suitable technique, such as physical vapor deposition (PVD), plating, or other suitable processes. In some embodiments, the seed layer 132' has a thickness in a range from about 0.1 nm to about 1000 nm.

A pinned layer 134' is then formed on the seed layer 132'. A purpose of the pinned layer 134' (also called as a synthetic anti-ferromagnetic (SAF) layer) is to fix, or pin, the magnetization direction of the reference layer 138' through anti-ferromagnetic coupling. In some embodiments, the pinned layer 134 includes a ferromagnetic material layer, therefore also referred to as pinned ferromagnetic layer. The ferromagnetic material may form permanent magnets and/or exhibit strong interactions with magnets. In some embodiments, the pinned layer 134 includes a cobalt-based film, e.g., a cobalt-iron-boron (CoFeB) film. The pinned layer 134 may alternatively include other materials, such as CoFeTa, NiFe, Co, CoFe, CoPt, CoPd, FePt, or the alloy of Ni, Co and Fe. As one example, the CoFeB film may be formed by PVD, or alternatively other suitable process.

The pinned layer 134' may alternatively include an SAF layer having a three-layer structure. In some embodiments, the pinned layer 134' includes a first pinned layer (or bottom pinned layer) and a second pinned layer (or top pinned layer) interposed by a spacer layer. The first and second pinned layers may include a ferromagnetic material. In one example, the ferromagnetic material in the first and/or second pinned layer(s) includes a CoFeB film. The ferromagnetic material layer may alternatively include other materials, such as CoFeTa, NiFe, Co, CoFe, CoPt, CoPd, FePt, or the alloy of Ni, Co and Fe.

The pinned layer 134' may alternatively include a buffer layer, a ferromagnetic layer, a bottom pinned layer, a top pinned layer, and a spacer film between the bottom ferromagnetic layer and the top ferromagnetic layer. The buffer layer may include Ta, Ru, or other suitable materials, and the ferromagnetic layer may include Co. The bottom pinned layer and the top pinned layer are both multilayers. Specifically, the bottom pinned layer includes two or more ferromagnetic films. Particularly, the bottom pinned layer includes a first film of a first ferromagnetic material and a second film of a second ferromagnetic material alternatively arranged. In some embodiments, there are N layers of first film and N layers of second film, and N is 1 to about 100. In some examples, the first and second ferromagnetic materials in the bottom pinned layer F1' include Co, Pt, Ni, Fe, or other suitable materials. For example, the first ferromagnetic material may be Co and the second ferromagnetic material may be Pt.

Further, the top pinned layer includes two or more ferromagnetic films. Particularly, the top pinned layer includes a third film of a third ferromagnetic material and a fourth film of a fourth ferromagnetic material alternatively arranged. In some embodiments, there are M layers of third film and M layers of second film, and M is 1 to about 100. In some embodiments, N is greater than M. In some examples, the third and fourth ferromagnetic materials in the top pinned layer include Co, Pt, Ni, Fe, or other suitable materials. For example, the third ferromagnetic material may be Co and the fourth ferromagnetic material may be Pt.

The spacer film is disposed between the bottom pinned layer and the top pinned layer. In some embodiments, the spacer film includes ruthenium (Ru). Alternatively, the spacer film may include other suitable material, such as Ir, Ti, Ta, Cu, or Ag. The spacer film may be formed by a PVD process, or another suitable process.

A spacer layer 136' is then formed on the pinned layer 134'. The spacer layer 136' may be made of a variety of conductive materials such as metal or metal alloy materials. For example, the spacer layer 136' may be made of tantalum (Ta), Molybdenum (Mo), tungsten (W), or other suitable conductive material(s) or layered combination thereof. The spacer layer 136' may be deposited by a suitable technique, such as physical vapor deposition (PVD), plating, or other suitable processes. In some embodiments, the spacer layer 136' has a thickness in a range from about 0.1 nm to about 1000 nm.

A reference layer 138' is formed on the spacer layer 136'. The reference layer 138' is a (single) ferromagnetic layer. The reference layer 138' may include Co, Fe, Ni, Mn, B, and/or their alloys, including for example, NiFe, NiFe, CoFe, $Y_3Fe_5O_{12}$, CoFeB, or compounds thereof, including other ferromagnetic materials. The reference layer 138' may be formed by processes such as, chemical vapor deposition (CVD), physical vapor deposition (PVD), electro-chemical deposition, molecular manipulation, and/or other processes. The reference layer 138' is illustrated in FIG. 15A as a single layer; however, the reference layer 138' may be synthetic. In some embodiments, the reference layer 138' has a thickness in a range from about 0.1 nm to about 1000 nm.

A tunnel barrier layer 142' is formed on the reference layer 138'. The tunnel barrier layer 142' is thin enough to allow the tunneling of electrons through it. The tunnel barrier layer 142' has a nonmagnetic composition and can be formed from any suitable material that may function as an electrical insulator. In some embodiments, the tunnel barrier layer 142' includes MgO. In some alternative embodiments, the tunnel barrier layer 142' includes aluminum. Examples of other dielectric materials that may be included in the tunnel barrier layer 142' include oxides or nitrides of Al, Mg, Si, Hf, Sr, or Ti such as, SiOx, SiNx, SiOxNy, AlOx, TOx, TiOx, AlNx, and/or combinations thereof. The tunnel barrier layer 142' may be formed by processes such as, chemical vapor deposition (CVD), plasma enhanced chemical vapor deposition (PECVD), physical vapor deposition (PVD), electro-chemical deposition, molecular manipulation, oxidation, and/or other suitable processes. In some embodiments, the tunnel barrier layer 142' has a thickness in a range from about 0.1 nm to about 1000 nm. The tunnel barrier layer 142' may electrically insulate the reference layer 138' from the free layer 144' independently, or in conjunction with other layers interposing the reference layer 138' and the free layer 144'.

Then, a free layer 144' is formed on the tunnel barrier layer 142'. The free layer 144' includes a bottom free layer F1', a top free layer F2', and a spacer film S' between the bottom free layer F1' and the top free layer F2'. In some examples, the bottom free layer F1' includes Co, Pt, Ni, Fe, or other suitable materials. For example, the bottom free layer F1' may be CoFeB. The bottom free layer F1' may have a thickness in a range from about 0.1 nm to about 1000 nm. Further, the top free layer F2' includes Co, Pt, Ni, Fe, or other suitable materials. For example, the top free layer F2' may be CoFeB. The top free layer F2' may have a thickness in a range from about 0.1 nm to about 1000 nm.

The spacer film S' is disposed between the bottom free layer F1' and the top free layer F2'. In some embodiments, the spacer film S' includes tantalum (Ta). Alternatively, the spacer film S' may include other suitable material, such as Ir, Ti, Ru, Cu, or Ag. In some examples, the spacer film S' may have a thickness in a range from about 0.1 nm to about 1000 nm. The spacer film S' may be formed by a PVD process, or another suitable process.

Then, a patterned mask layer M1 is formed over the first MTJ structure 130'. In some embodiments, a mask material may be formed over the first MTJ structure 130' by using spin-coating or other suitable techniques, and the mask material is patterned to be the patterned mask layer M1. In some embodiments, the patterned mask layer M1 may be a photoresist, a hard mask layer, a SiNx layer, or combinations thereof. The patterned mask layer M1 may have a thickness in a range from about 0.1 nm to about 1000 nm.

Figure 4A:
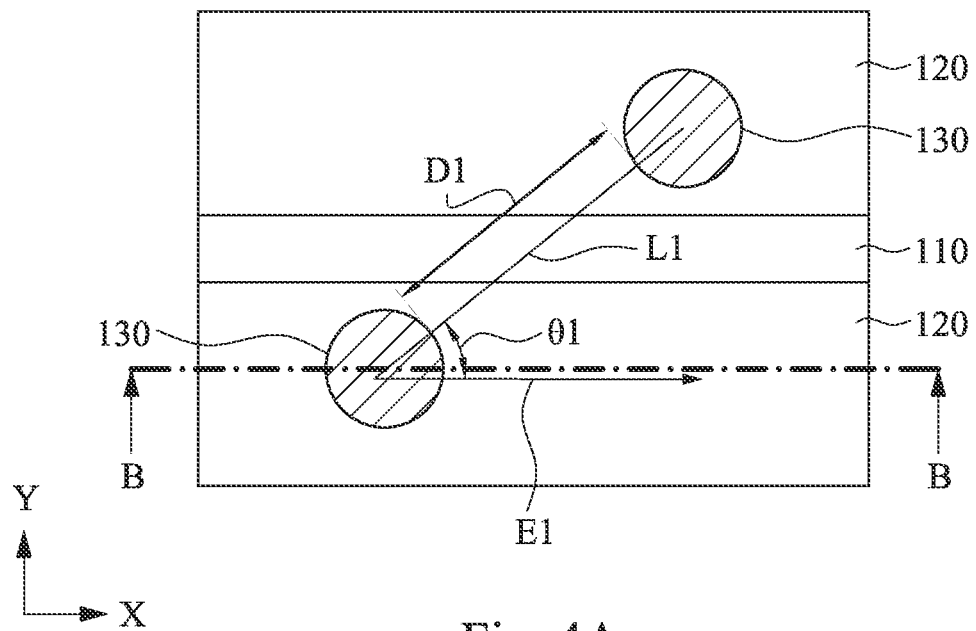
Figure 4B:
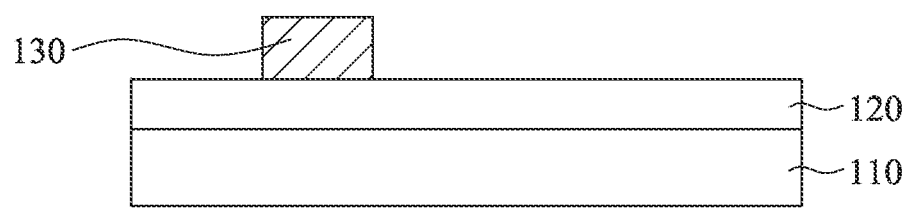
Figure 15B:
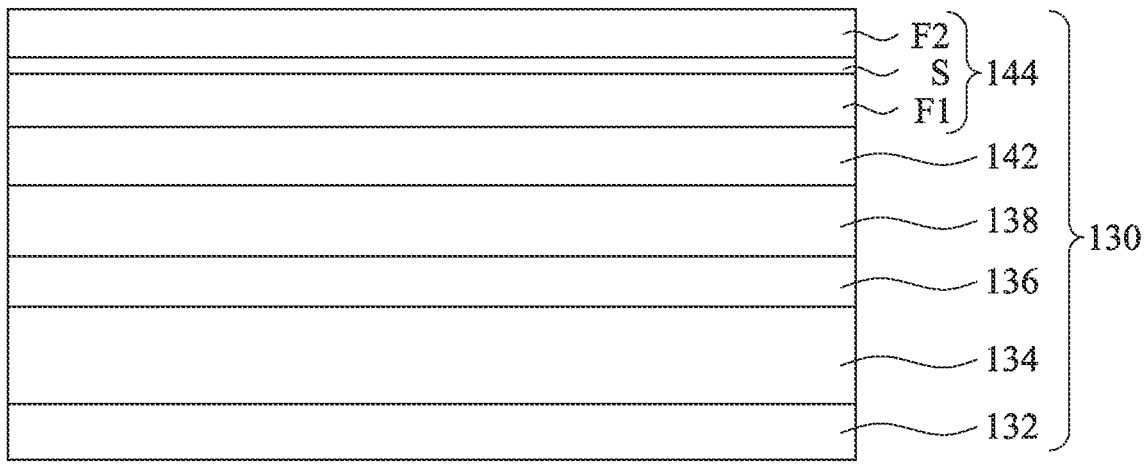
FIG. 15B is an enlarged cross-sectional view of the first MTJ stacks in FIG. 4B.

Reference is made to FIGS. 4A, 4B, and 15B, where FIG. 15B is an enlarged cross-sectional view of the first MTJ stacks 130 in FIG. 4B. The first MTJ structure 130' of FIGS. 3A and 3B are patterned to form the first MTJ stacks 130 using the patterned mask layer M1 (see FIGS. 3A and 3B) as a mask. Each of the first MTJ stacks 130 includes a seed layer 132, a pinned layer 134, a spacer layer 136, a reference layer 138, a tunnel barrier layer 142, and a free layer 144, and the free layer 144 includes a bottom free layer F1, a top free layer F2, and a spacer film S between the bottom layer F1 and the top free layer F2. The memory information is stored in a magnetization state of the free layer 144. The relative magnetization direction between the free layer 144 and the reference layer 138 determines the resistance of the first MTJ stack 130. In some embodiments, the reference layer 138 and the free layer 144 may have a magnetization orientation that can be both in-plane or out-of plane with respect to the top surface of the first MTJ stack 130. The patterning process in FIGS. 4A and 4B may be performed by using an etching process, such as reactive ion etching (RIE), ion beam etching (IBE), wet etching, or combinations thereof. After the patterning process, the patterned mask layer M1 is removed by using stripping, ashing, or etching process (such as reactive ion etching (RIE), ion beam etching (IBE), wet etching, or combinations thereof).

In FIG. 4A, the first MTJ stacks 130 are respectively formed on the bottom conductive lines 120. The (adjacent) first MTJ stacks 130 are neither aligned in the X direction nor in the Y direction. For example, the (adjacent) first MTJ stacks 170 are arranged in diagonal. In some embodiments, a connection line L1 of the (adjacent) first MTJ stacks 130 and an extension direction E1 of the bottom conductive line 120 form an angle θ1 greater than about 0 degree and less than about 90 degree (i.e., an acute angle). That is, the connection line L1 and the extension direction E1 are neither parallel nor perpendicular to each other. In some embodiments, the angle θ1 is about 40 degrees to about 50 degrees, e.g., about 45 degrees, and the present disclosure is not limited in this respect. Further, a distance D1 is formed between the adjacent first MTJ stacks 130. In some embodiments, the distance D1 depends on the lithography limitation, which may be greater than about 10 nm in some embodiments. In some embodiments, the first MTJ stack 130 may has a radius in a range of about 0.1 nm to about 1000 nm, e.g., about 25 nm. A top view of the first MTJ stack 130 may be circular, elliptical, rectangular, square or other suitable shapes with or without rounded corners.

Figure 5A:
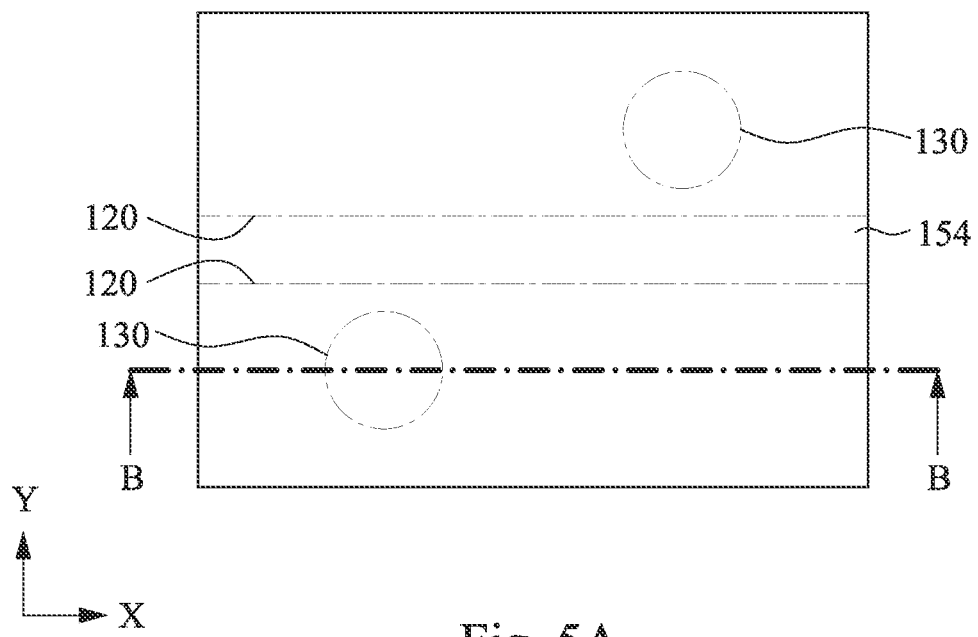
Figure 5B:
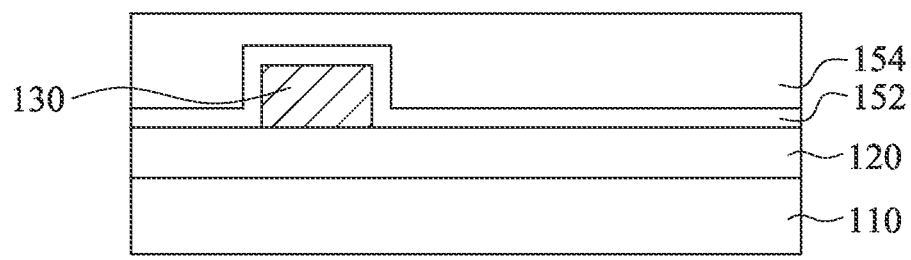

In operation S18 of method M10 in FIG. 1A, a first dielectric structure 150 is formed over the first MTJ stacks 130, as shown in FIGS. 5A, 5B, 6A, and 6B. Reference is made to FIGS. 5A and 5B. A first encapsulation layer 152 is formed over the first MTJ stacks 130 and the bottom conductive lines 120, lining the upper surface and sidewalls of the first MTJ stacks 130. In some embodiments, the first encapsulation layer 152 may be formed by suitable deposition technique and may be formed conformally. Further, the first encapsulation layer 152 may be formed of, for example, silicon nitride, silicon carbide, or combinations thereof. The first encapsulation layer 152 may have a thickness in a range from about 0.1 nm to about 1000 nm.

Then, a first dielectric layer 154 is formed over the first encapsulation layer 152 and covers the first MTJ stacks 130. The first dielectric layer 154 may include, for example, silicon oxide, silicon nitride, low-k silicon oxide such as a porous silicon oxide layer, other suitable dielectric material, combinations thereof, or the like. The first dielectric layer 154 may have a thickness in a range from about 0.1 nm to about 1000 nm.

Figure 6A:
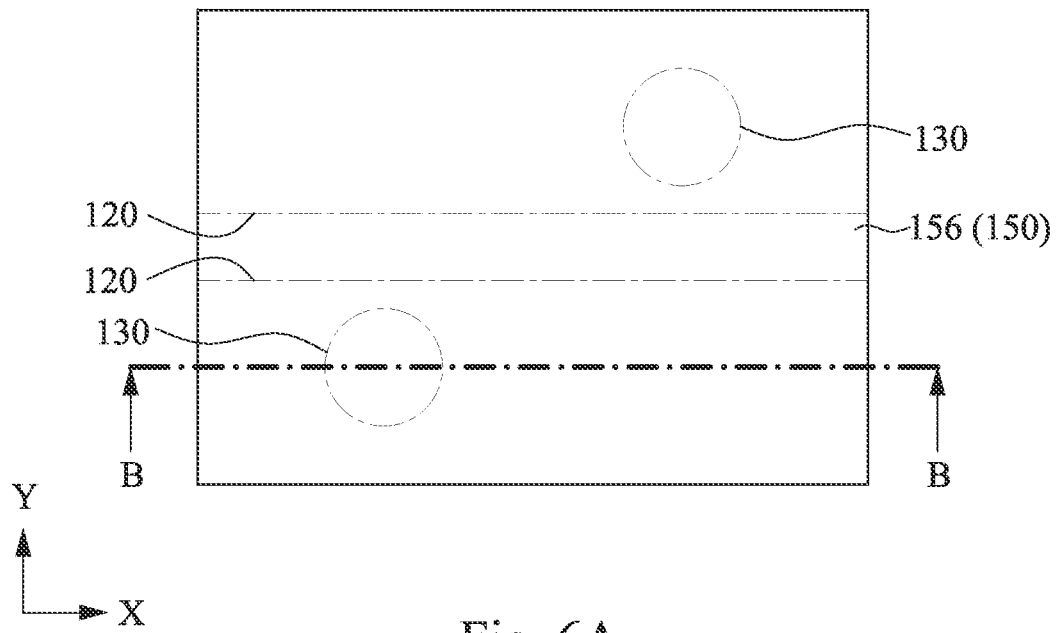
Figure 6B:
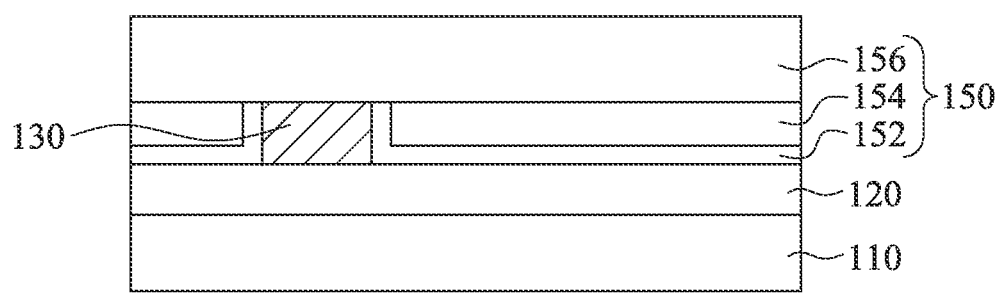

Reference is made to FIGS. 6A and 6B. A planarization process is performed to the first dielectric layer 154 and the first encapsulation layer 152 until top surfaces of the first MTJ stacks 130 are exposed. For example, the planarization process is a CMP process.

Then, a second dielectric layer 156 is formed over the first encapsulation layer 152, the first dielectric layer 154, and covers the first MTJ stacks 130. The second dielectric layer 156 may include, for example, silicon oxide, silicon nitride, low-k silicon oxide such as a porous silicon oxide layer, other suitable dielectric material, combinations thereof, or the like. The second dielectric layer 156 may have a thickness in a range from about 0.1 nm to about 1000 nm. The second dielectric layer 156, the first dielectric layer 154, and the first encapsulation layer 152 are together referred to as the first dielectric structure 150.

Figure 7A:
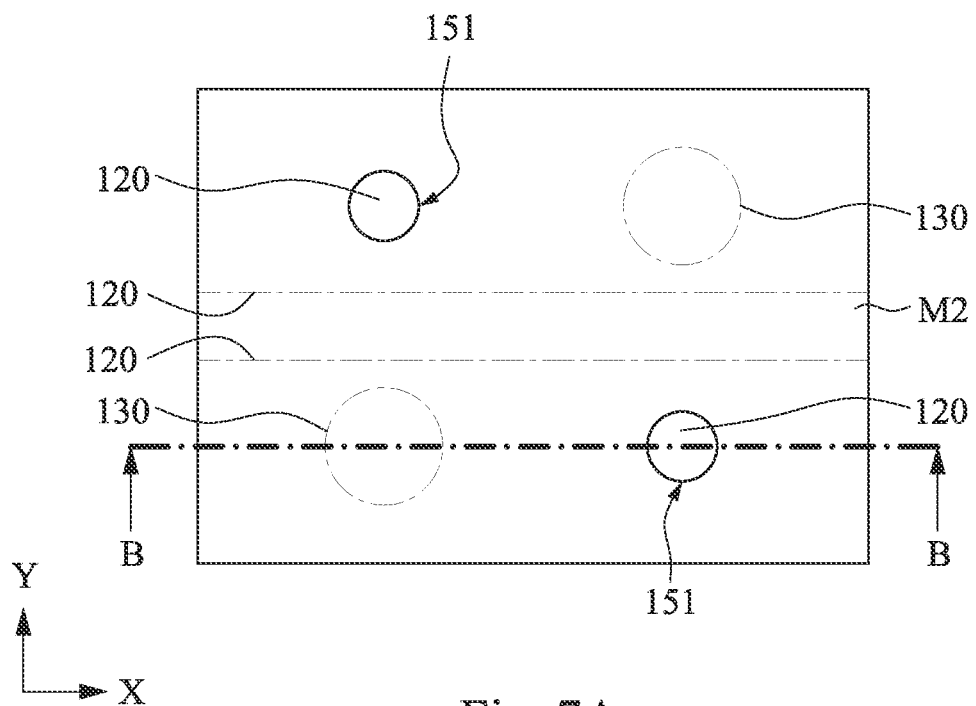
Figure 7B:
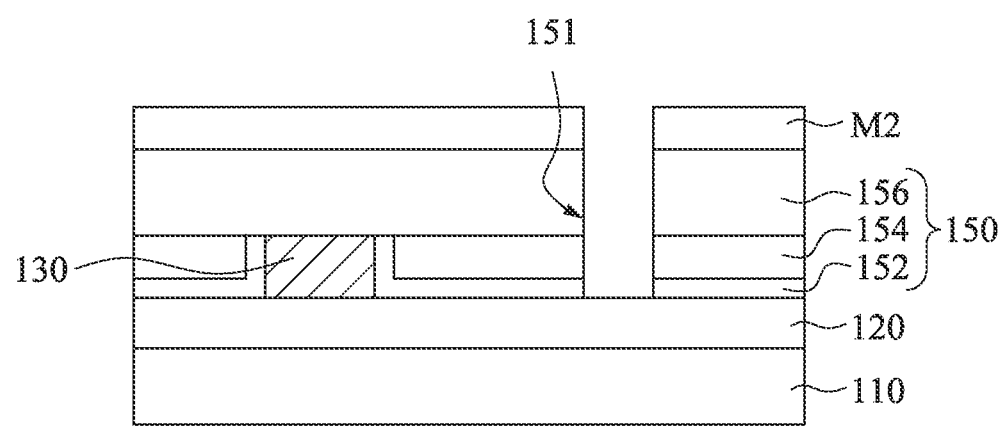

In operation S20 of method M10 in FIG. 1A, a plurality of first vias 160 are formed in the first dielectric structure 150, as shown in FIGS. 7A, 7B, 8A, and 8B. Reference is made to FIGS. 7A and 7B. More specific, another patterned mask layer M2 is formed over the first dielectric structure 150, and the patterned mask layer M2 exposes portions of the first dielectric structure 150. In some embodiments, a mask material may be formed over the first dielectric structure 150 by using spin-coating or other suitable techniques, and the mask material is patterned to be the patterned mask layer M2. In some embodiments, the patterned mask layer M2 may be a photoresist, a hard mask layer, a SiNx layer, or combinations thereof. The patterned mask layer M2 may have a thickness in a range from about 0.1 nm to about 1000 nm.

Then, a plurality of first openings 151 are formed in the first dielectric structure 150. The second dielectric layer 156, the first dielectric layer 154, and the first encapsulation layer 152 of the first dielectric structure 150 are patterned (etched) using the patterned mask layer M2 as a mask to form the first openings 151 in the second dielectric layer 156, the first dielectric layer 154, and the first encapsulation layer 152. The first openings 151 respectively expose portions of the bottom conductive lines 120.

Figure 8A:
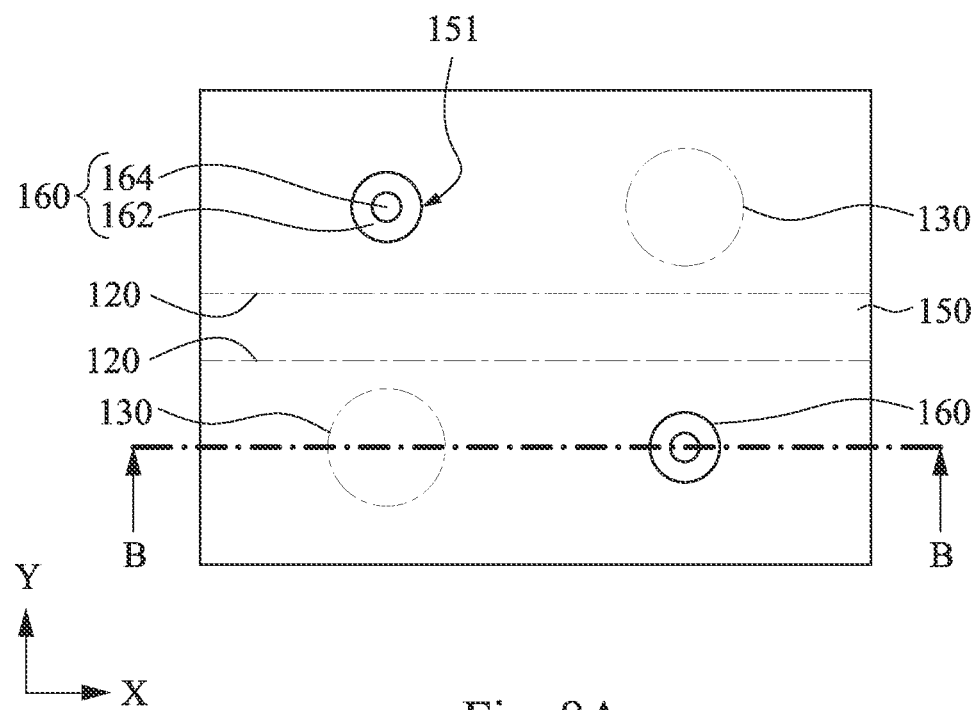
Figure 8B:
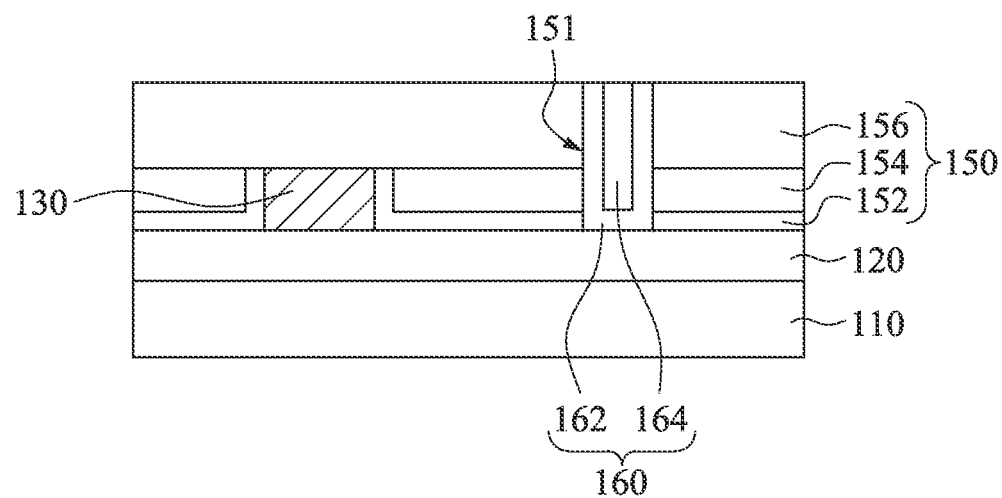

Reference is made to FIGS. 8A and 8B. The patterned mask layer M2 (see FIGS. 7A and 7B) is removed by using stripping, ashing, or etching process (such as reactive ion etching (RIE), ion beam etching (IBE), wet etching, or combinations thereof). Then, barrier layers 162 are conformally formed in the first openings 151. The barrier layers 162 can improve the adhesion between the bottom conductive lines 120 and a material formed thereon (such as the filling materials 164), or prevent a diffusion of a metal from diffusing from the via into the first dielectric structure 150. The barrier layers 162 may include metal nitride materials. For example, the barrier layers 162 include Ta, TaN, or other suitable materials. In some embodiments, the barrier layers 162 include a single layer or multiple layers. For a multiple-layer configuration, the layers include different compositions of metal nitride from each other. The barrier layers 162 may have a thickness in a range from about 0.1 nm to about 1000 nm.

Filling materials 164 are respectively formed in the first openings 151 and over the barrier layers 162. The filling materials 164 are electrically connected to the bottom conductive lines 120. In some embodiments, a blanket barrier layer and a filling layer are sequentially formed on the first dielectric structure 150 and in the first openings 151, and excessive portions of the filling layer and the blanket barrier layer are removed by performing a CMP process to form the filling materials 164 and the barrier layers 162. The filling materials 164 can be made of Ti, TiN, or other suitable materials. The filling material 164 and the barrier layer 162 are referred to as the first via 160.

Figure 9A:
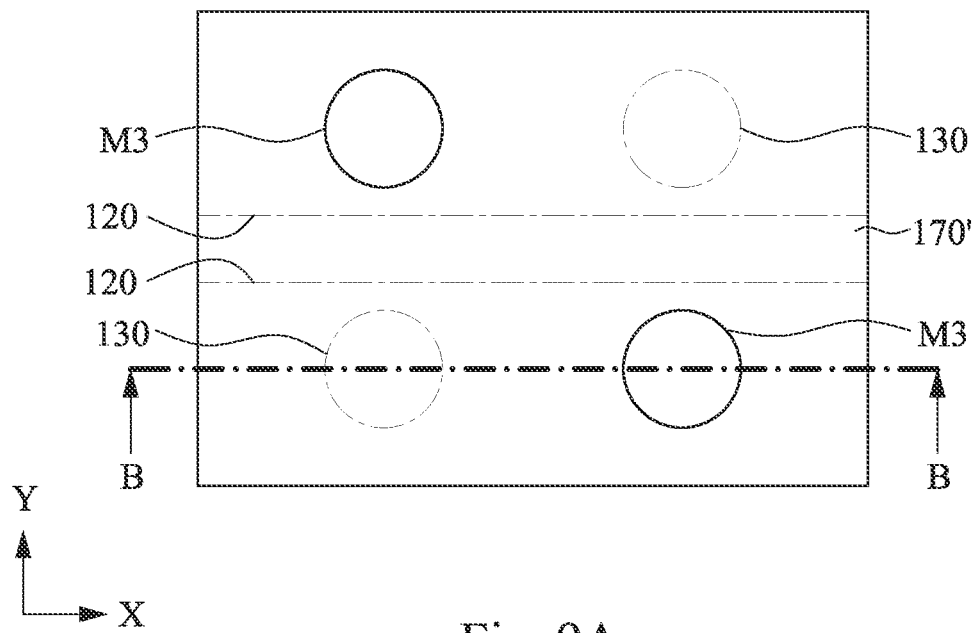
Figure 9B:
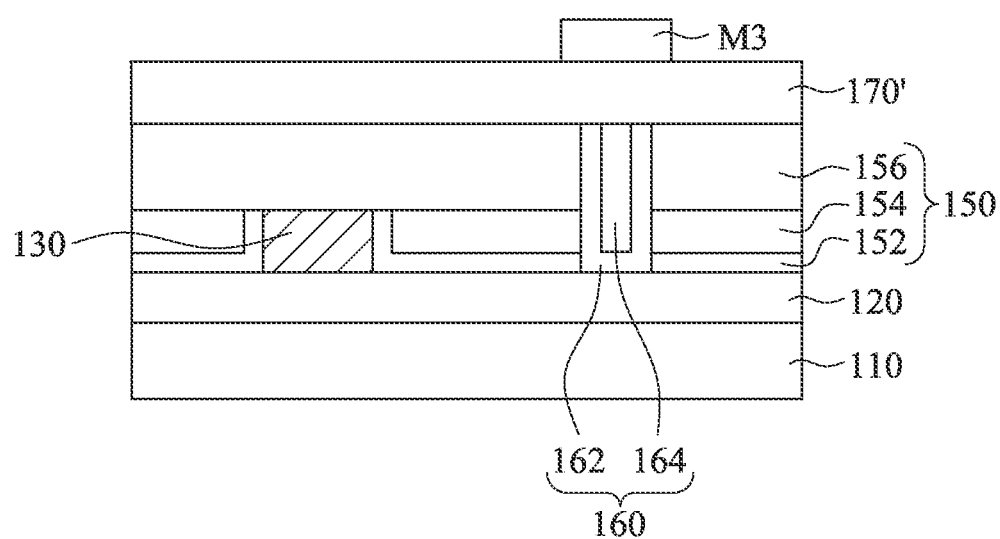

In operation S22 of method M10 in FIG. 1A, a plurality of second MTJ stacks 170 are formed on the first dielectric structure 150 and respectively on the first vias 160, as shown in FIGS. 9A, 9B, 10A, and 10B. Reference is made to FIGS. 9A and 9B. A second MTJ structure 170' is formed over the first dielectric structure 150, such that the second MTJ structure 170' covers the first vias 160. The second MTJ structure 170' may have the same or similar structure to the first MTJ structure 130' in FIGS. 3A and 3B. In some embodiments, the second MTJ structure 170' has the structure shown in FIG. 15A. That is, the second MTJ structure 170' includes a seed layer, a pinned layer, a spacer layer, a reference layer, a tunnel barrier layer, and a free layer, and the free layer includes a bottom free layer, a top free layer, and a spacer film between the bottom layer and the top free layer.

Then, another patterned mask layer M3 is formed over the second MTJ structure 170'. In some embodiments, a mask material may be formed over the second MTJ structure 170' by using spin-coating or other suitable techniques, and the mask material is patterned to be the patterned mask layer M3. In some embodiments, the patterned mask layer M3 may be a photoresist, a hard mask layer, a SiNx layer, or combinations thereof. The patterned mask layer M3 may have a thickness in a range from about 0.1 nm to about 1000 nm.

Figure 10A:
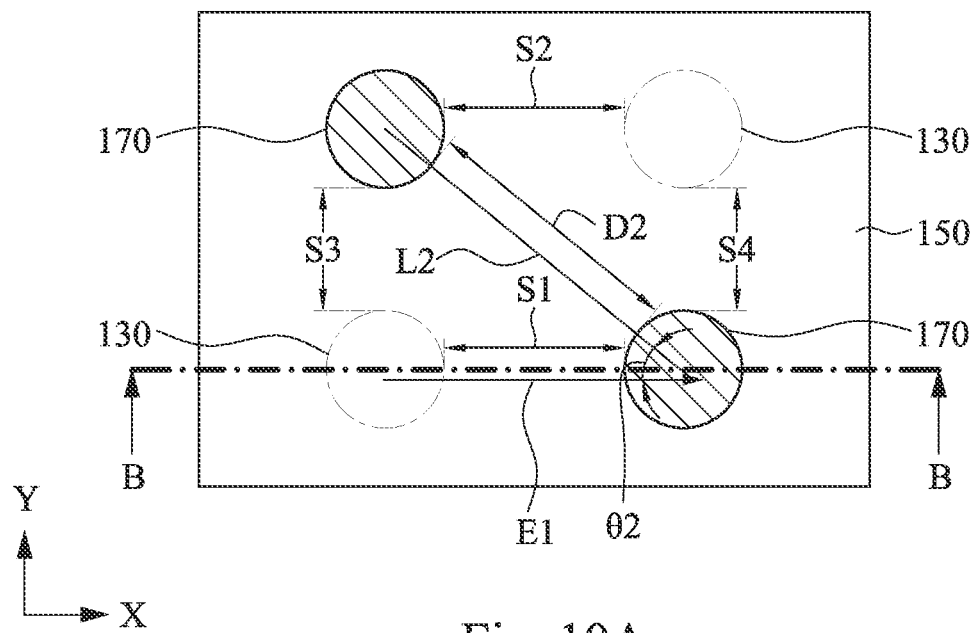
Figure 10B:
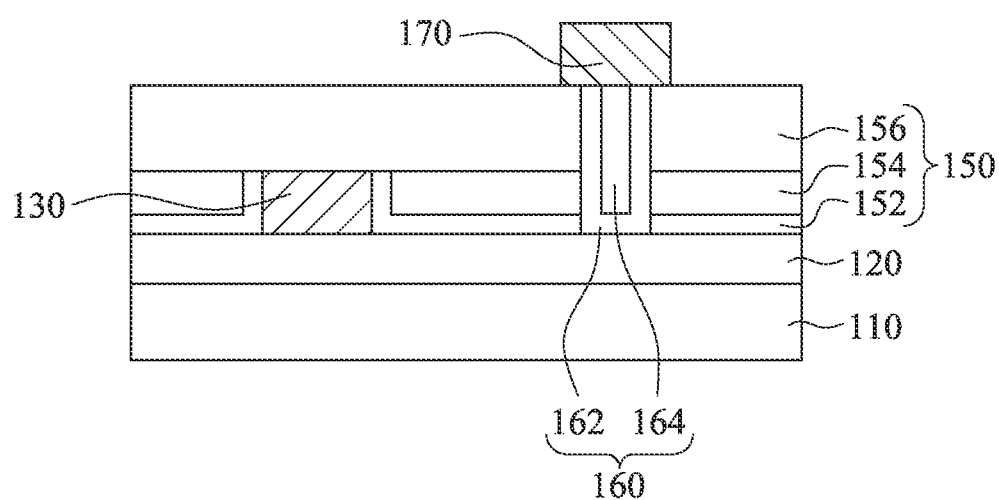

Reference is made to FIGS. 10A and 10B. The second MTJ structure 170' of FIGS. 9A and 9B are patterned to form the second MTJ stacks 170 using the patterned mask layer M3 (see FIGS. 9A and 9B) as a mask. Each of the second MTJ stacks 170 may have the structure shown in FIG. 15B, i.e., the second MTJ stack 170 includes a seed layer, a pinned layer, a spacer layer, a reference layer, a tunnel barrier layer, and a free layer, and the free layer includes a bottom free layer, a top free layer, and a spacer film between the bottom layer and the top free layer. The patterning process in FIGS. 10A and 10B may be performed by using an etching process, such as reactive ion etching (RIE), ion beam etching (IBE), wet etching, or combinations thereof. After the patterning process, the patterned mask layer M3 is removed by using stripping, ashing, or etching process (such as reactive ion etching (RIE), ion beam etching (IBE), wet etching, or combinations thereof).

In FIG. 10A, the second MTJ stacks 170 are respectively formed on the first vias 160. In some embodiments, the first via 160 has a radius less than a radius of the second MTJ stack 170. For example, the radius of the first via 160 may be in a range of about 0.1 nm to about 1000 nm, e.g., about 12.5 nm. The (adjacent) second MTJ stacks 170 are neither aligned in the X direction nor in the Y direction. For example, the (adjacent) second MTJ stacks 170 are arranged in diagonal. In some embodiments, a connection line L2 of the (adjacent) second MTJ stacks 170 and the extension direction E1 of the bottom conductive line 120 form an angle θ2 greater than about 0 degree and less than about 90 degree (i.e., an acute angle). That is, the connection line L2 and the extension direction E1 are neither parallel nor perpendicular to each other. In some embodiments, the angle θ2 is about 40 degrees to about 50 degrees, e.g., about 45 degrees, and the present disclosure is not limited in this respect. Further, a distance D2 is formed between the adjacent second MTJ stacks 170. In some embodiments, the distance D2 depends on the lithography limitation, which may be greater than about 10 nm in some embodiments. A top view of the second MTJ stack 170 may be circular, elliptical, rectangular, square or other suitable shapes with or without rounded corners.

In FIG. 10A, one of the first MTJ stacks 130 and one of the second MTJ stacks 170 are electrically connected to the same bottom conductive line 120, and this first MTJ stack 130 and second MTJ stack 170 are at different levels. In FIG. 10B, the second MTJ stack 170 is higher than the first MTJ stack 130. Since the first MTJ stack 130 and the second MTJ stack 170 are at different levels, the lateral spacing S1 between these two MTJ stacks 130 and 170 can be reduced while the first and second MTJ stacks 130 and 170 are well isolated from each other. Similarly, another one of the first MTJ stacks 130 and another one of the second MTJ stacks 170 are electrically connected to another one of the bottom conductive line 120, and these two MTJ stacks 130 and 170 have reduced lateral spacing S2. Also, the lateral spacings S3 and S4 shown in FIG. 10A can be reduced with this configuration. That is, the distance between two adjacent MTJ stacks does not depend on the lateral spacing S1, S2, S3, and/or S4. Rather, the distance between two adjacent MTJ stacks depends on the distances D1 (see FIG. 4A) and/or D2 (see FIG. 10A). In some embodiments, the lateral spacing S1, S2, S3, and/or S4 is shorter than the distance D1 and/or D2. The first and second MTJ stacks 130 and 170 may overlap with each other in the top view (i.e., the spacing S1, S2, S3, and/or S4 may be negative) as long as the distances D1 and/or D2 are positive (or greater than the lithography limitation).

Figure 11A:
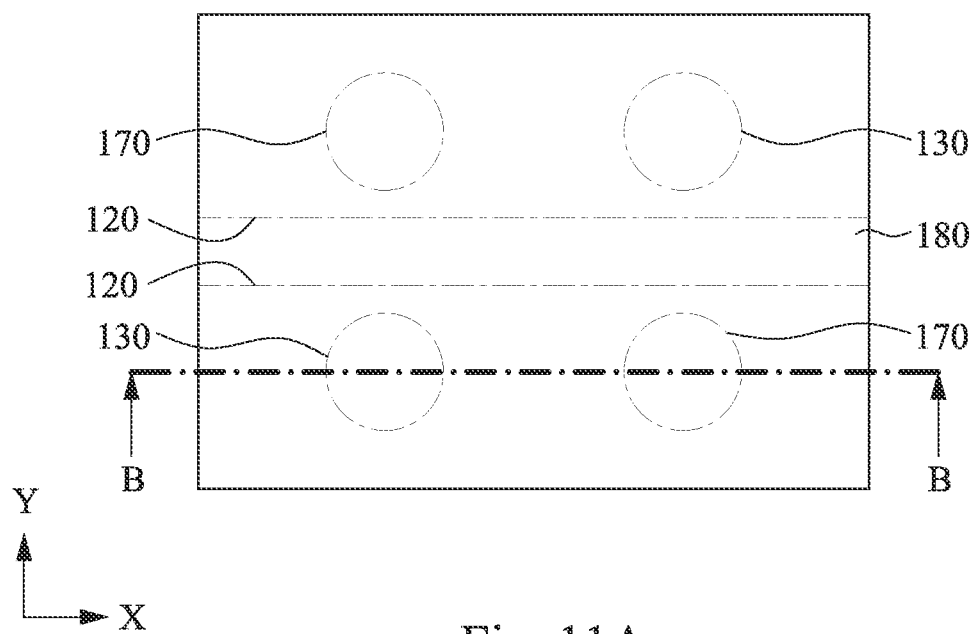
Figure 11B:
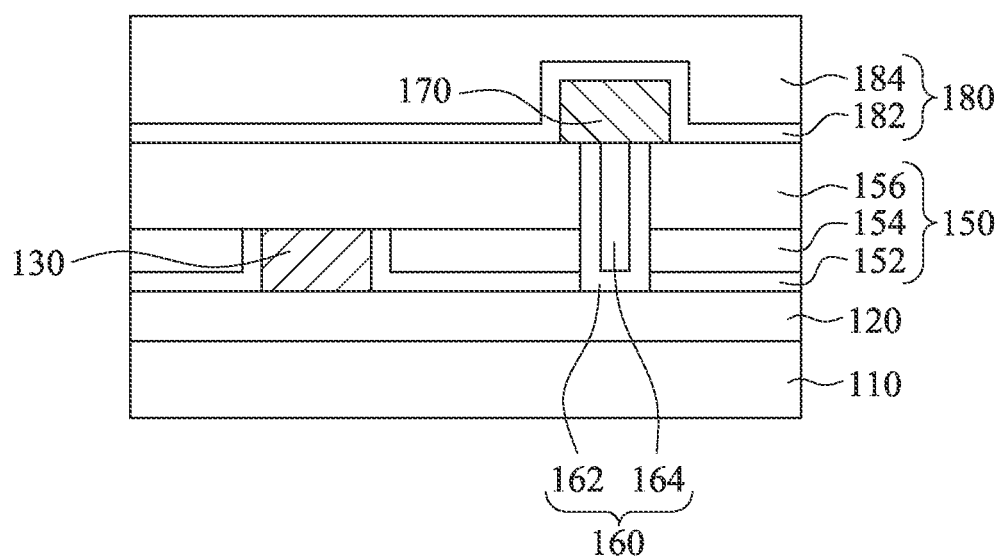

In operation S24 of method M10 in FIG. 1A, a second dielectric structure 180 is formed over the second MTJ stacks 170 and the first dielectric structure 150, as shown in FIGS. 11A and 11B. A second encapsulation layer 182 is formed over the second MTJ stacks 170 and the first dielectric structure 150, lining the upper surface and sidewalls of the second MTJ stacks 170. In some embodiments, the second encapsulation layer 182 may be formed by suitable deposition technique and may be formed conformally. Further, the second encapsulation layer 182 may be formed of, for example, silicon nitride, silicon carbide, or combinations thereof. The second encapsulation layer 182 may have a thickness in a range from about 0.1 nm to about 1000 nm.

Then, a third dielectric layer 184 is formed over the second encapsulation layer 182. The third dielectric layer 184 may include, for example, silicon oxide, silicon nitride, low-k silicon oxide such as a porous silicon oxide layer, other suitable dielectric material, combinations thereof, or the like. The third dielectric layer 184 may have a thickness in a range from about 0.1 nm to about 1000 nm. The second encapsulation layer 182 and the third dielectric layer 184 are together referred to as the second dielectric structure 180.

Figure 12A:
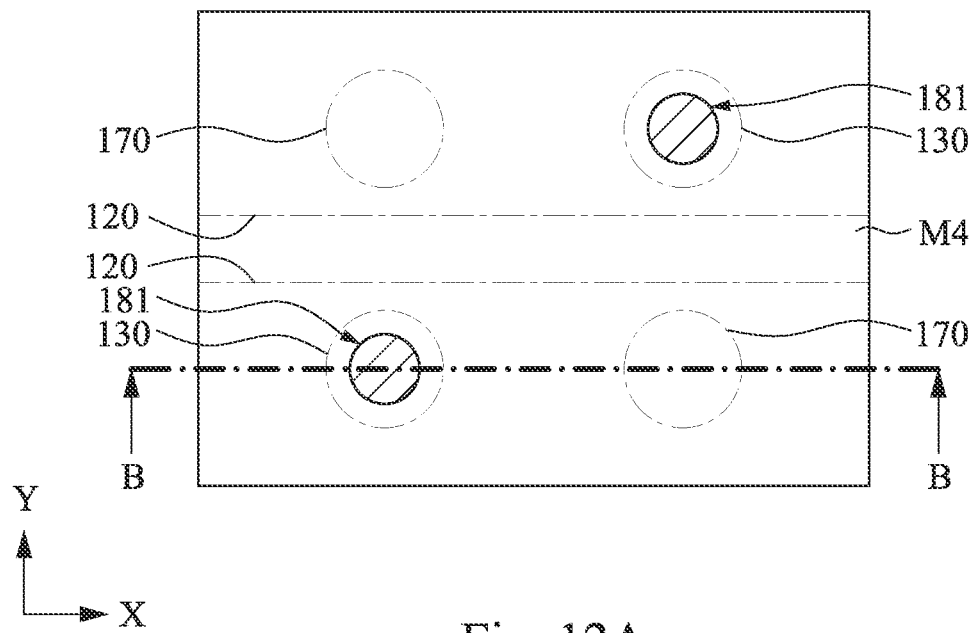
Figure 12B:
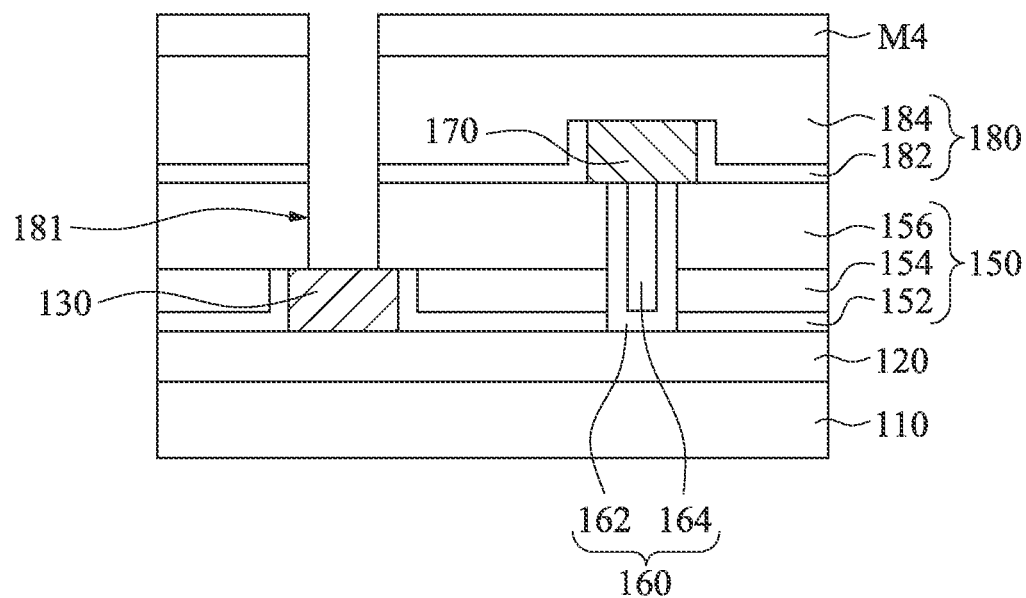

In operation S26 of method M10 in FIG. 1B, a plurality of second openings 181 are formed in the second dielectric structure 180 and the first dielectric structure 150, as shown in FIGS. 12A and 12B. More specific, another patterned mask layer M4 is formed over the second dielectric structure 180. In some embodiments, a mask material may be formed over the second dielectric structure 180 by using spin-coating or other suitable techniques, and the mask material is patterned to be the patterned mask layer M4. In some embodiments, the patterned mask layer M4 may be a photoresist, a hard mask layer, a SiNx layer, or combinations thereof. The patterned mask layer M4 may have a thickness in a range from about 0.1 nm to about 1000 nm.

Then, a plurality of second openings 181 are formed in the second dielectric structure 180 and the first dielectric structure 150. The second dielectric structure 180 and the first dielectric structure 150 are patterned (etched) using the patterned mask layer M4 as a mask to form the second openings 181 in the second dielectric structure 180 and the first dielectric structure 150. The second openings 181 respectively expose portions of the first MTJ stacks 130.

Figure 13A:
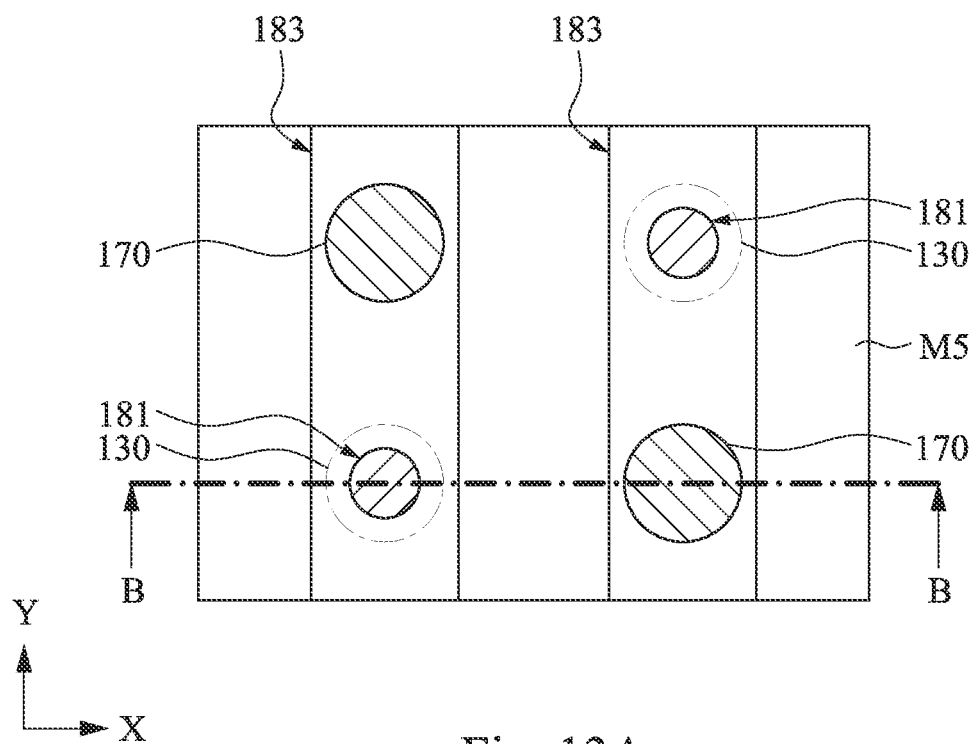
Figure 13B:
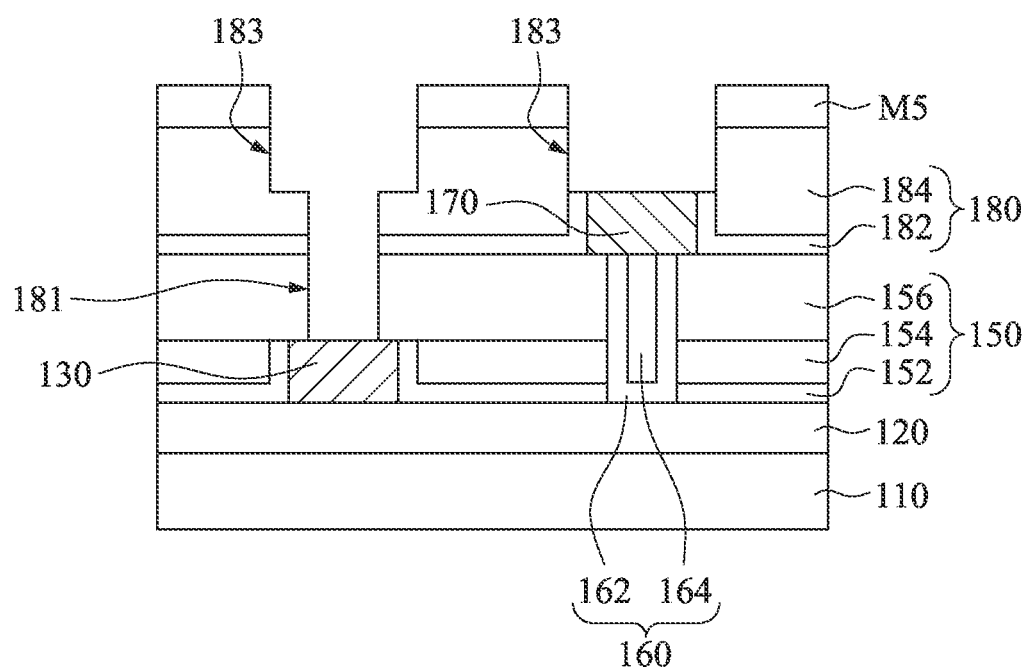

In operation S28 of method M10 in FIG. 1B, a plurality of trenches 183 are formed in the second dielectric structure 180, as shown in FIGS. 13A and 13B. More specific, the patterned mask layer M4 (see FIGS. 12A and 12B) is removed by using stripping, ashing, or etching process (such as reactive ion etching (RIE), ion beam etching (IBE), wet etching, or combinations thereof). Then, another patterned mask layer M5 is formed over the second dielectric structure 180. In some embodiments, a mask material may be formed over the second dielectric structure 180 by using spin-coating or other suitable techniques, and the mask material is patterned to be the patterned mask layer M5. In some embodiments, the patterned mask layer M5 may be a photoresist, a hard mask layer, a SiNx layer, or combinations thereof. The patterned mask layer M5 may have a thickness in a range from about 0.1 nm to about 1000 nm.

Then, a plurality of trenches 183 are formed in the second dielectric structure 180. The second dielectric structure 180 is patterned (etched) using the patterned mask layer M5 as a mask to form the trenches 183 in the second dielectric structure 180. The trenches 183 expose the second MTJ stacks 170 and the first MTJ stacks 130.

Figure 14A:
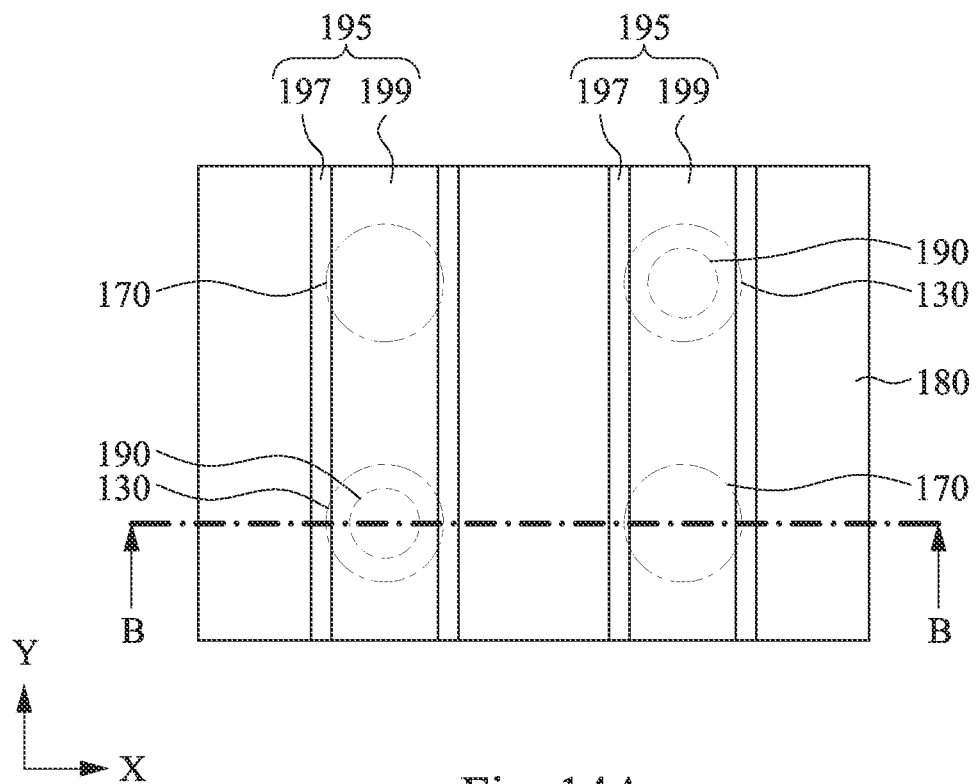
Figure 14B:
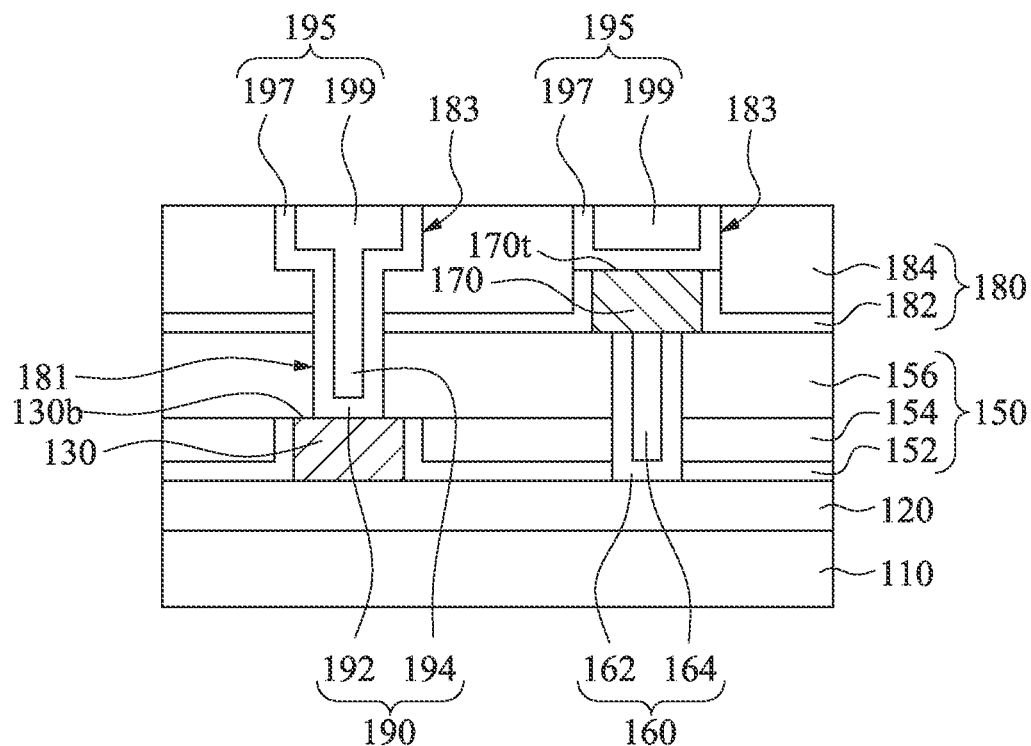

In operation S30 of method M10 in FIG. 1B, a plurality of second vias 190 are formed in the second openings 181 and a plurality of top conductive lines 195 are formed in the trenches 183, as shown in FIGS. 14A and 14B. The patterned mask layer M5 (see FIGS. 13A and 13B) is removed by using stripping, ashing, or etching process (such as reactive ion etching (RIE), ion beam etching (IBE), wet etching, or combinations thereof). Then, barrier layers 192 and 197 are conformally formed in the second openings 181 and the trenches 183. The barrier layers 192 and 197 can improve the adhesion between the MTJ stacks (i.e., the first MTJ stacks 130 and/or the second MTJ stacks 170) and a material formed thereon (such as the filling materials 194 and 199), or prevent a diffusion of a metal from diffusing from the via/line into the first dielectric structure 150 and the second dielectric structure 180. The barrier layers 192 and 197 may include metal nitride materials. For example, the barrier layers 192 and 197 include Ta, TaN, or other suitable materials. In some embodiments, the barrier layers 192 and 197 include a single layer or multiple layers. For a multiple-layer configuration, the layers include different compositions of metal nitride from each other. The barrier layers 192 and 197 may have a thickness in a range from about 0.1 nm to about 1000 nm.

Filling materials 194 and 199 are respectively formed in the second openings 181 and the trenches 183. The filling materials 194 and 199 are electrically connected to the first MTJ stacks 130 and the second MTJ stacks 170. In some embodiments, a blanket barrier layer and a filling layer are sequentially formed on the second dielectric structure 180 and in the second openings 181 and the trenches 183, and excessive portions of the filling layer and the blanket barrier layer are removed by performing a CMP process to form the filling materials 194 and 199 and the barrier layer 192 and 197. The filling materials 194 and 199 can be made of Ti, TiN, or other suitable materials. The filling material 194 and the barrier layer 192 are referred to as the second via 190, and the filling material 199 and the barrier layer 197 are referred to as the top conductive lines 195. In some embodiments, the second via 190 has a radius less than a radius of the first MTJ stack 130. For example, the radius of the second via 190 may be in a range of about 0.1 nm to about 1000 nm, e.g., about 12.5 nm.

In FIG. 14A, the top conductive lines 195 extend in the Y direction, and one of the top conductive lines 195 is electrically connected to one first MTJ stack 130 and one second MTJ stack 170, where these first MTJ stack 130 and second MTJ stack 170 are arranged along the Y direction.

Figure 16:
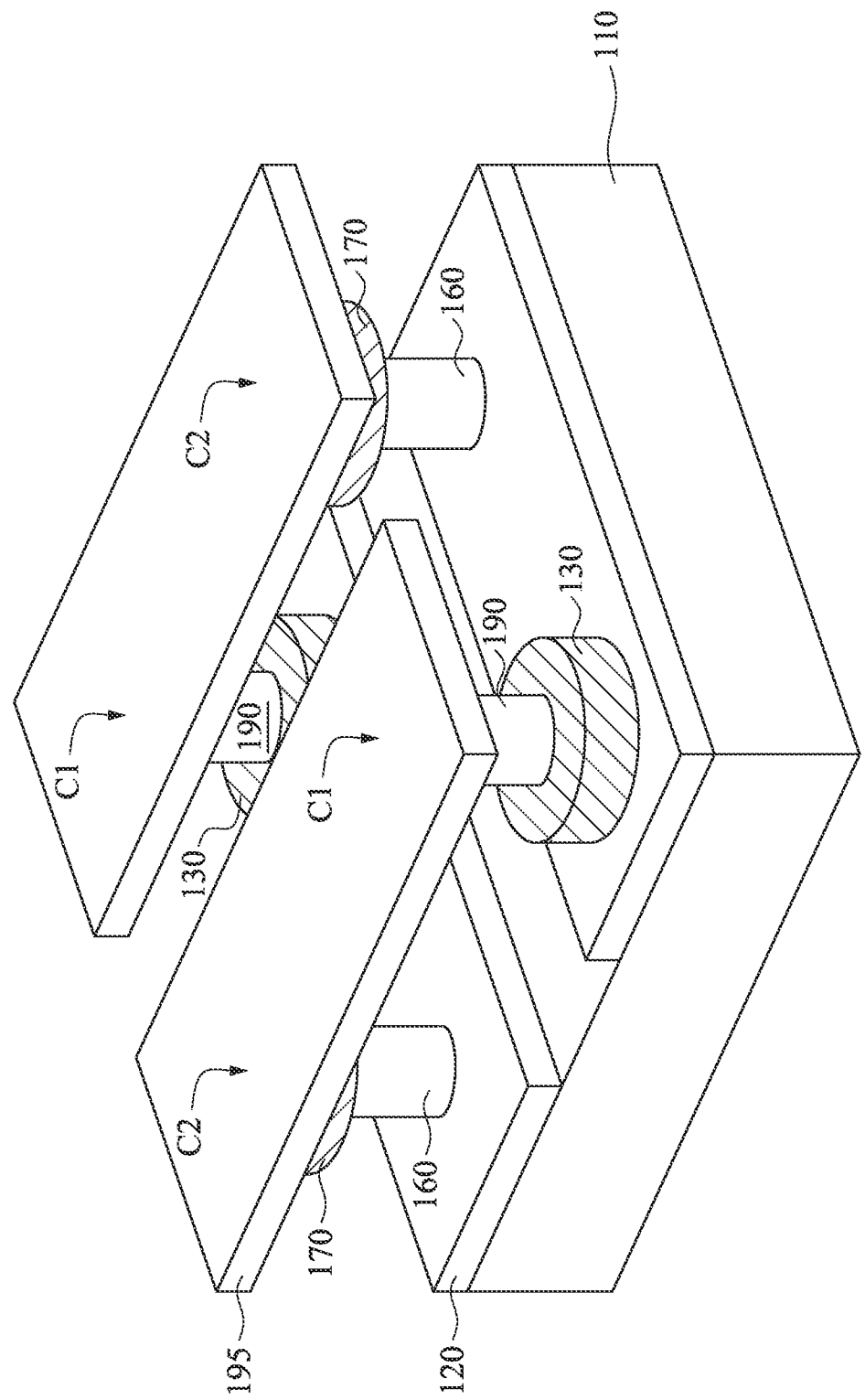
FIG. 16 is a perspective view of the memory device in FIGS. 14A and 14B in accordance with various embodiments of the present disclosure.

FIG. 16 is a perspective view of the memory device in FIGS. 14A and 14B in accordance with various embodiments of the present disclosure. The dielectric materials (such as the first dielectric structure 150 and the second dielectric structure 180 in FIG. 14B) are omitted in FIG. 16 for clarity. Also, the barrier layers in the vias and or conductive lines are not shown in FIG. 16 for clarity. The memory device includes a plurality of bottom conductive lines 120, a plurality of first MTJ stacks 130, a plurality of second MTJ stacks 170, and a plurality of top conductive lines 195. The bottom conductive lines 120 are disposed over a wafer 110. The first MTJ stacks 130 are respectively disposed over the bottom conductive lines 120. In some embodiments, the first MTJ stacks 130 are respectively in contact with the bottom conductive lines 120. The second MTJ stacks 170 are at a different level from the first MTJ stacks 130 and electrically connected to the bottom conductive lines 120 respectively through first vias 160. For example, a top surface 170t of the second MTJ stack 170 is higher than a top surface 130b of the first MTJ stack 130 (see FIG. 14B). The top conductive lines 195 are disposed over the first MTJ stacks 130 and the second MTJ stacks 170. In some embodiments, the second MTJ stacks 170 are respectively in contact with the top conductive lines 195. The first MTJ stacks 130 are electrically connected to the top conductive lines 195 respectively through second vias 190.

The first MTJ stack 130 and the second via 190 form a memory cell C1, and the second MTJ stack 170 and the first via 160 form another memory cell C2. The memory cells C1 and C2 are alternately arranged. For example, the bottom conductive lines 120 extend in the X direction, and two of the memory cells C1 and C2, which are connected to the same bottom conductive line 120, are arranged in the X direction. Further, the top conductive lines 195 extend in the Y direction, and two of the memory cells C1 and C2, which are connected to the same top conductive line 195, are arranged in the X direction. The two memory cells C1 and C2 are adjacent to each other but the MTJ stacks thereof are at different levels. For example, in FIG. 16, the second MTJ stack 170 is at a level higher than the first MTJ stack 130. The top surface 170t of the second MTJ stack 170 is higher than the top surface 130b of the first MTJ stack 130 (see FIG. 14B). With this configuration, the memory cell C1 may be close to the memory cell C2 (e.g., the first MTJ stack 130 and the second MTJ stack 170 may overlap with each other in a top view), and the layout area of the memory device can be reduced.

In FIGS. 14B and 16, the first MTJ stacks 130 and the second MTJ stacks 170 are both disposed between adjacent conductive lines (i.e., the bottom conductive lines 120 and the top conductive lines 195). The memory cells C1 and C2 have substantially the same height. That is, a total height of the first MTJ stack 130 and the second via 190 may be substantially the same as a total height of the second MTJ stack 170 and the first via 160.

Figure 17A:
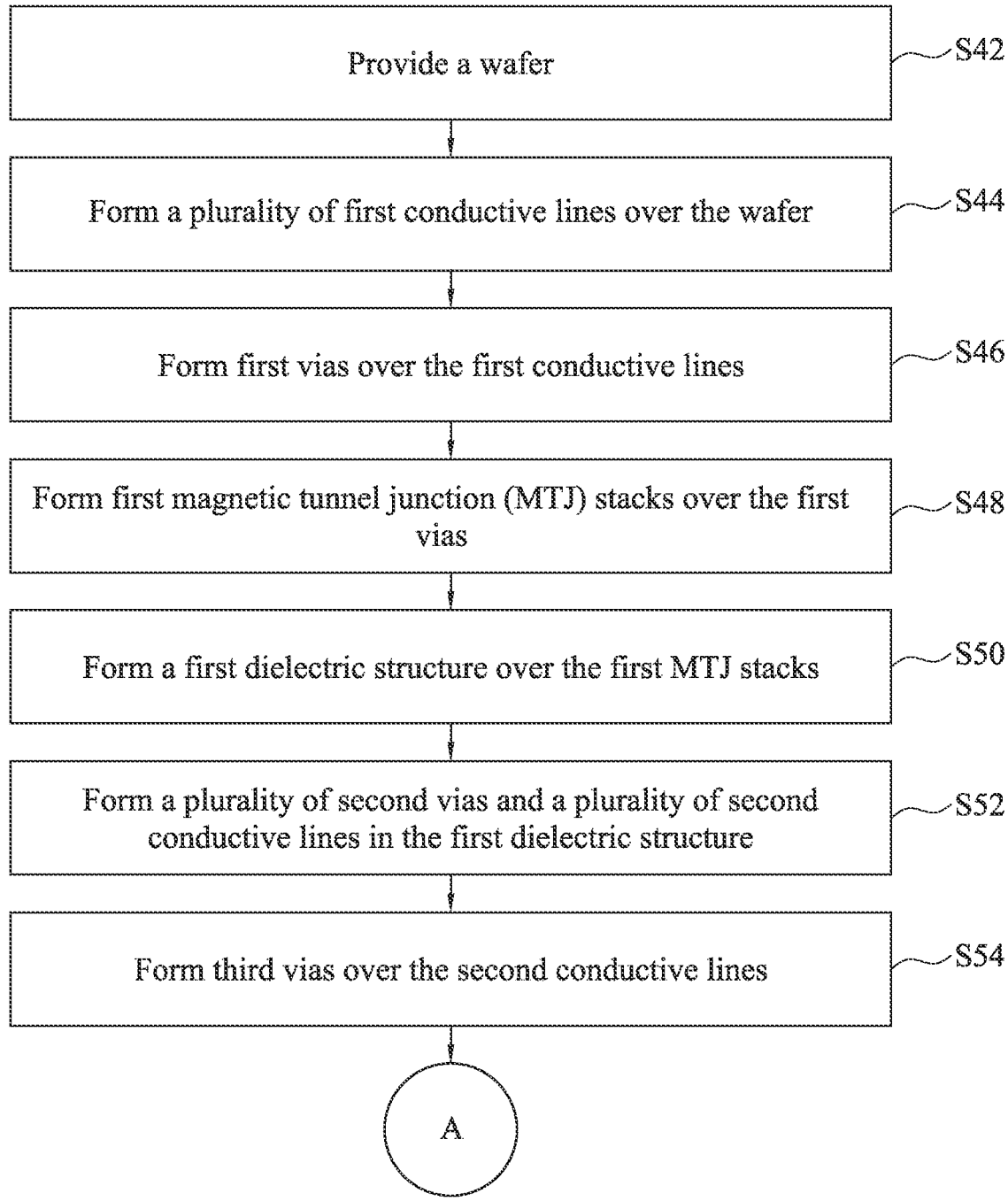
FIGS. 17A and 17B are a flowchart of a method for manufacturing a memory device according to aspects of the present disclosure in various embodiments.
Figure 17B:
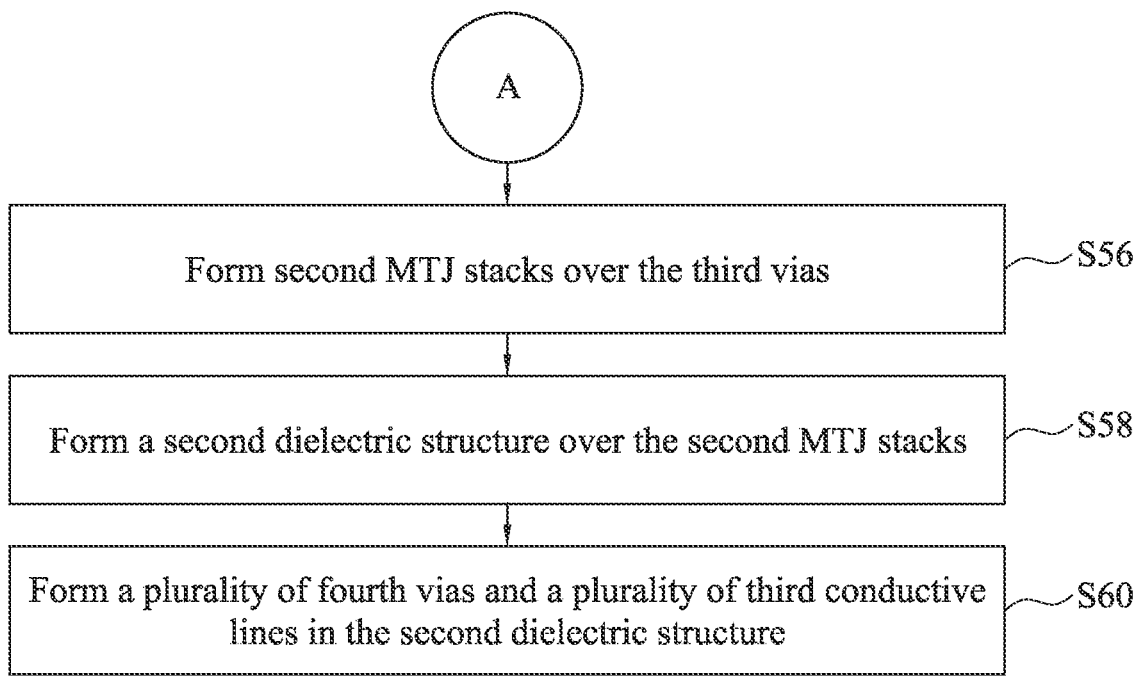

FIGS. 17A and 17B are a flowchart of a method M40 for manufacturing a memory device according to aspects of the present disclosure in various embodiments. Various operations of the method M40 are discussed in association with diagrams FIGS. 18A-31B, where FIGS. 18A, 19A, 20A, 21A, 22A, 23A, 24A, 25A, 26A, 27A, 28A, 29A, 30A, and 31A respectively illustrate top views of the semiconductor device at various stages in accordance with some embodiments of the present disclosure, and FIGS. 18B, 19B, 20B, 21B, 22B, 23B, 24B, 25B, 26B, 27B, 28B, 29B, 30B, and 31B illustrate cross-sectional views of lines B-B respectively illustrated in FIGS. 18A, 19A, 20A, 21A, 22A, 23A, 24A, 25A, 26A, 27A, 28A, 29A, 30A, and 31A. Throughout the various views and illustrative embodiments, like reference numbers are used to designate like elements. The present embodiment may repeat reference numerals and/or letters used in FIGS. 2A-14B. This repetition is for the purpose of simplicity and clarity and does not in itself dictate a relationship between the various embodiments and/or configurations discussed. In the following embodiments, the structural and material details described before are not repeated hereinafter, and only further information is supplied to perform the semiconductor devices of FIGS. 18A-31B.

Figure 18A:
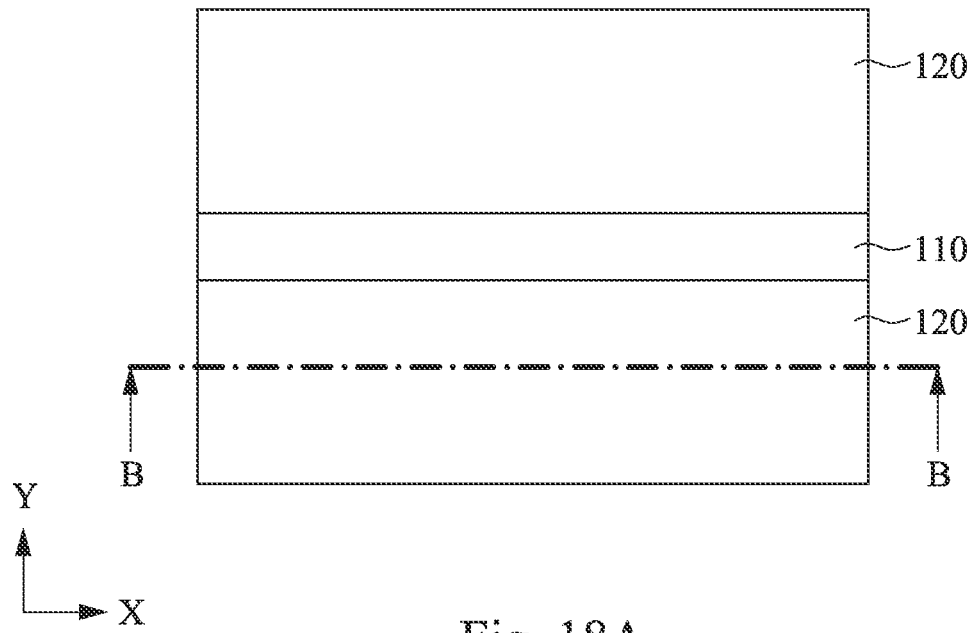
FIGS. 18A, 19A, 20A, 21A, 22A, 23A, 24A, 25A, 26A, 27A, 28A, 29A, 30A, and 31A respectively illustrate top views of the semiconductor device at various stages in accordance with some embodiments of the present disclosure.
Figure 18B:
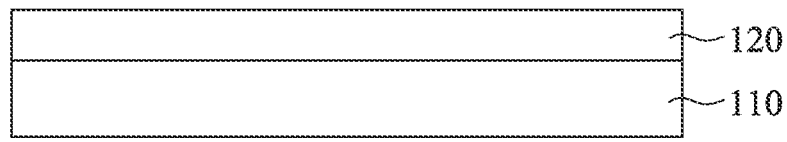
FIGS. 18B, 19B, 20B, 21B, 22B, 23B, 24B, 25B, 26B, 27B, 28B, 29B, 30B, and 31B illustrate cross-sectional views of lines B-B respectively illustrated in FIGS. 18A, 19A, 20A, 21A, 22A, 23A, 24A, 25A, 26A, 27A, 28A, 29A, 30A, and 31A.

In operation S42 of method M40 in FIG. 17A, a wafer 110 is provided, as shown in FIGS. 18A and 18B. In operation S44 of method M40 in FIG. 17A, a plurality of bottom conductive lines 120 are formed over the wafer 110, as shown in FIGS. 18A and 18B.

Figure 19A:
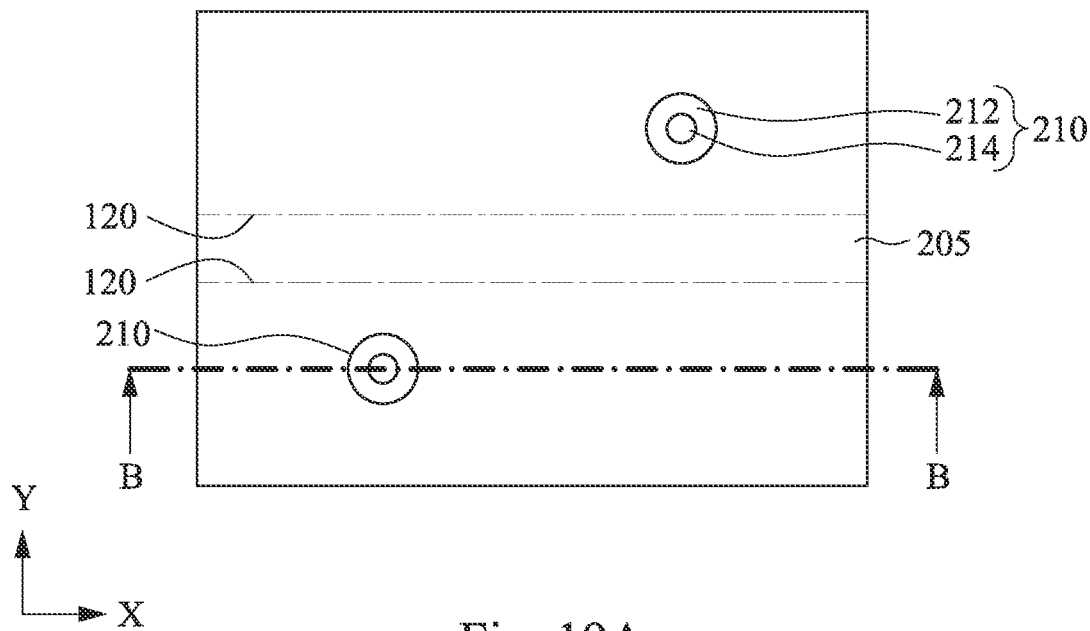
Figure 19B:
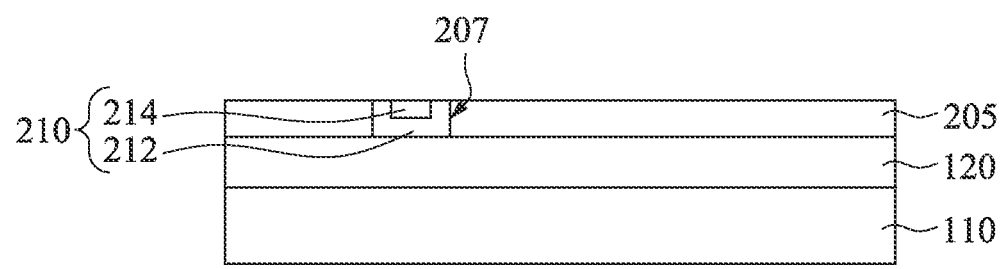

In operation S46 of method M40 in FIG. 17A, a plurality of first vias 210 are formed over the bottom conductive lines 120, as shown in FIGS. 19A and 19B. More specific, a first dielectric layer 205 is formed over the wafer 110 and covers the bottom conductive lines 120. The first dielectric layer 205 may have the same or similar materials to the first dielectric layer 154 of FIG. 5B. Then, a plurality of first openings 207 are formed in the first dielectric layer 205. The first openings 207 respectively expose the bottom conductive lines 120. Since the formation of the first openings 207 is similar to the formation of the first openings 151 in FIGS. 7A and 7B, a detailed description thereof is not repeated herein.

Subsequently, first vias 210 are respectively formed in the first opening 207. In some embodiments, each of the first vias 210 includes a barrier layer 212 and a filling material 214 over the barrier layer 212. Since the formation of the first vias 210 and the material thereof are similar to the first vias 160 in FIGS. 8A and 8B, a detailed description thereof is not repeated herein.

Figure 20A:
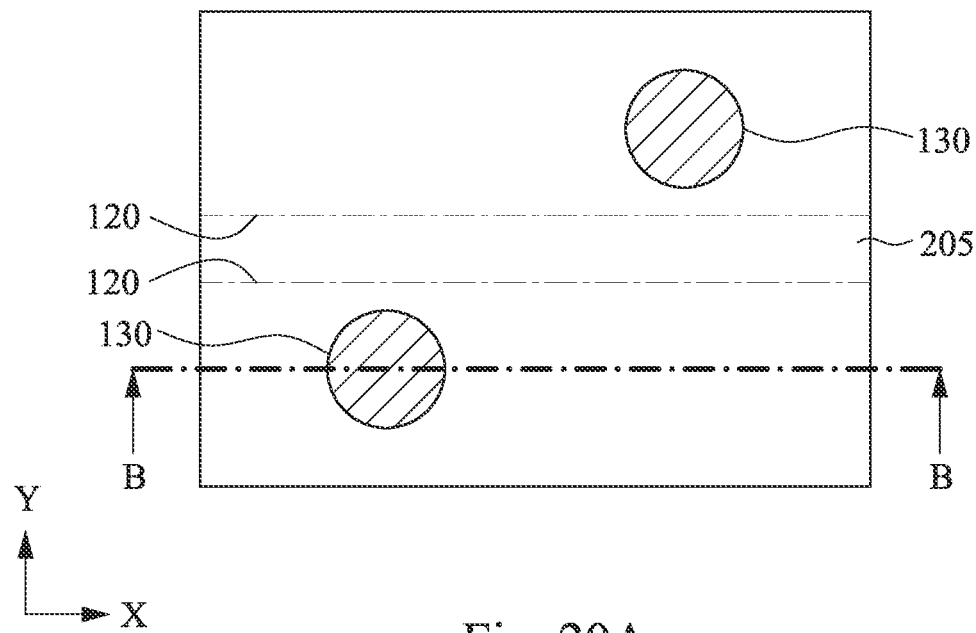
Figure 20B:
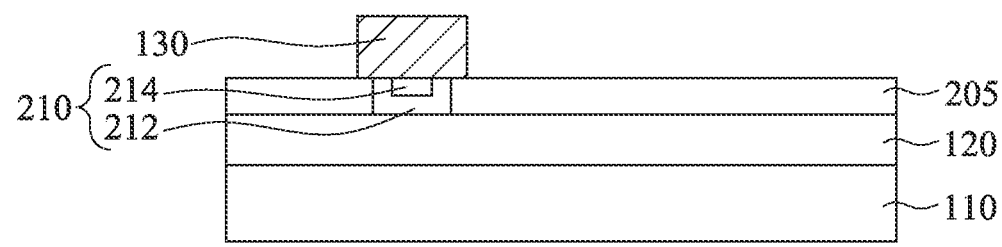

In operation S48 of method M40 in FIG. 17A, a plurality of first MTJ stacks 130 are formed over the first vias 210, as shown in FIGS. 20A and 20B. For example, a MTJ structure (e.g., the MTJ structure in FIG. 15A) may be formed over the first dielectric layer 205 and cover the first vias 210. A patterned mask layer is then formed over the MTJ structure and exposes portions of the MTJ structure. The MTJ structure is subsequently patterned using the patterned mask layer as a mask to form the first MTJ stacks 130, and the patterned mask layer is removed. The first MTJ stacks 130 are respectively formed over the first vias 210. In other words, the first MTJ stacks 130 are electrically connected to the bottom conductive lines 120 respectively through the first vias 210.

Figure 21A:
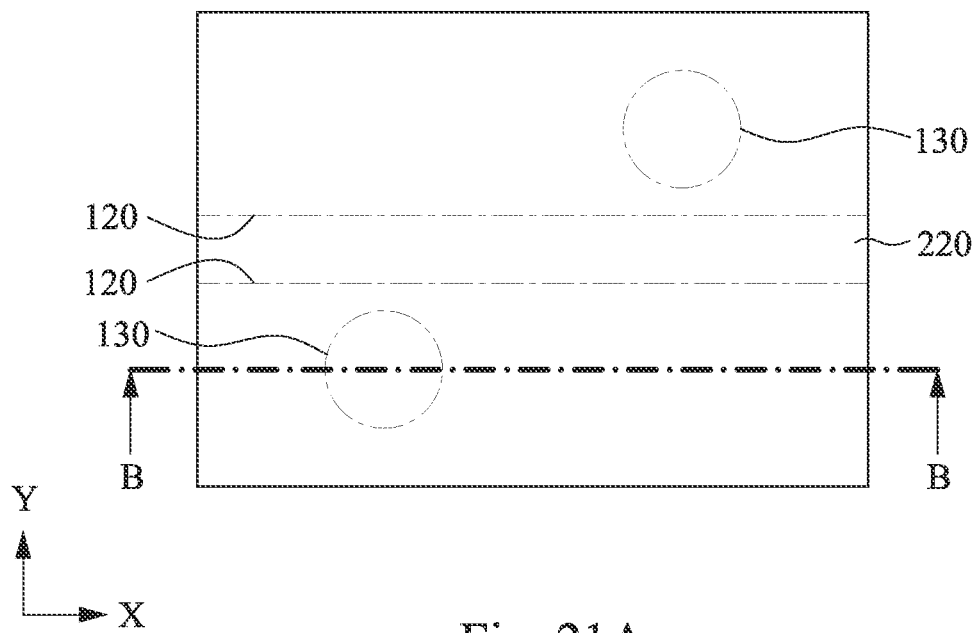
Figure 21B:
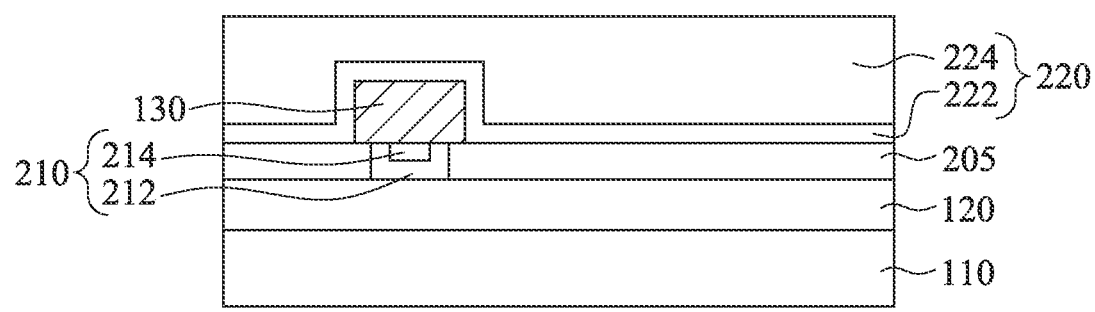

In operation S50 of method M40 in FIG. 17A, a first dielectric structure 220 is formed over the first MTJ stacks 130, as shown in FIGS. 21A and 21B. A first encapsulation layer 222 is formed over the first MTJ stacks 130 and the first dielectric layer 205, lining the upper surface and sidewalls of the first MTJ stacks 130. In some embodiments, the first encapsulation layer 222 may be formed by suitable deposition technique and may be formed conformally. Further, the first encapsulation layer 222 may have the same or similar materials to the first encapsulation layer 152 of FIG. 5B. The first encapsulation layer 222 may have a thickness in a range from about 0.1 nm to about 1000 nm.

Then, a second dielectric layer 224 is formed over the first encapsulation layer 222. The second dielectric layer 224 may have the same or similar materials to the first dielectric layer 154 of FIG. 5B. The second dielectric layer 224 may have a thickness in a range from about 0.1 nm to about 1000 nm. The first encapsulation layer 222 and the second dielectric layer 224 are together referred to as the first dielectric structure 220.

Figure 22A:
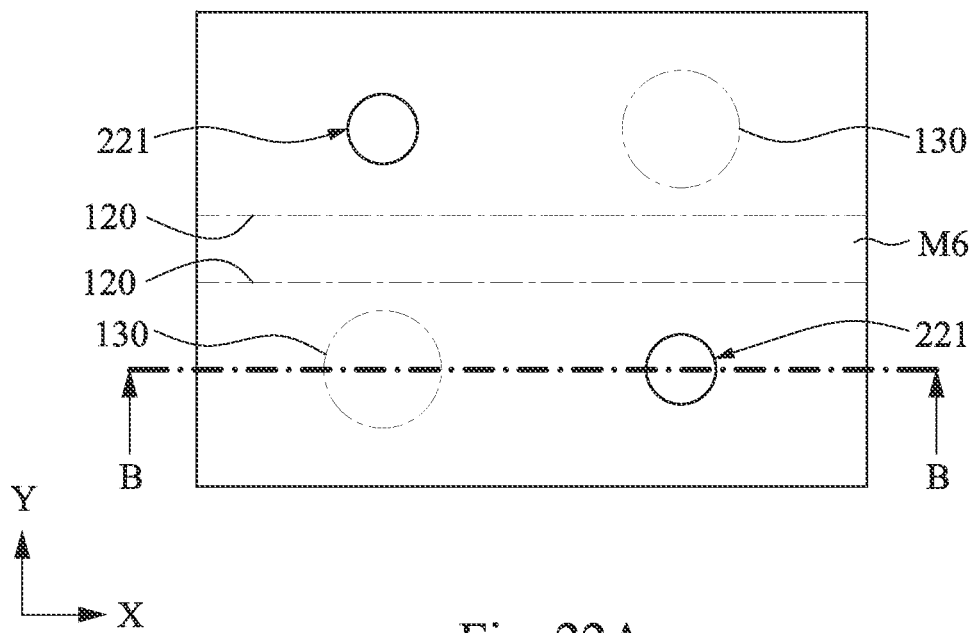
Figure 22B:
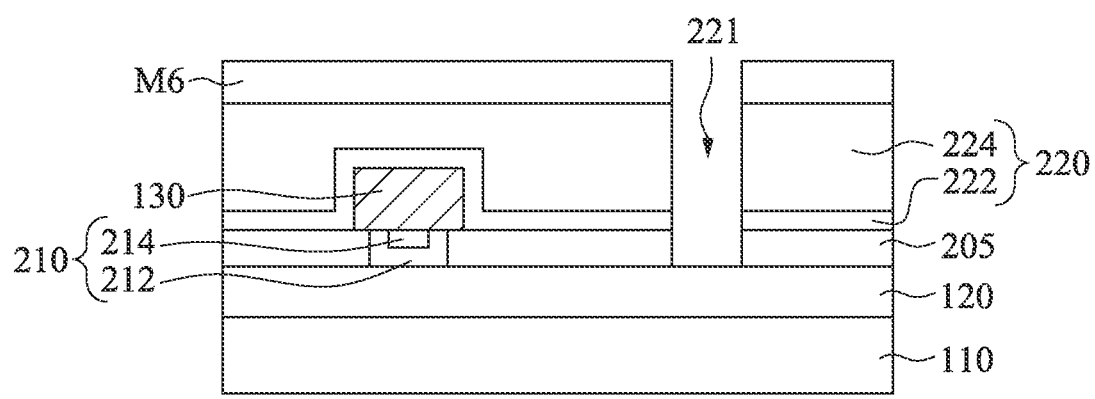

In operation S52 of method M40 in FIG. 17A, a plurality of second vias 230 and a plurality of middle conductive lines 240 are formed in the first dielectric structure 220, as shown in FIGS. 22A, 22B, 23A, 23B, 24A, and 24B. Reference is made to FIGS. 22A and 22B. Another patterned mask layer M6 is formed over the first dielectric structure 220. The patterned mask layer M6 may have the same or similar materials to the patterned mask layer M1 of FIGS. 3A and 3B. The patterned mask layer M6 may have a thickness in a range from about 0.1 nm to about 1000 nm.

Then, a plurality of second openings 221 are formed in the first dielectric structure 220 and the first dielectric layer 205. The first dielectric structure 220 and the first dielectric layer 205 are patterned (etched) using the patterned mask layer M6 as a mask to form the second openings 221 in the first dielectric structure 220 and the first dielectric layer 205. The second openings 221 respectively expose portions of the bottom conductive lines 120.

Figure 23A:
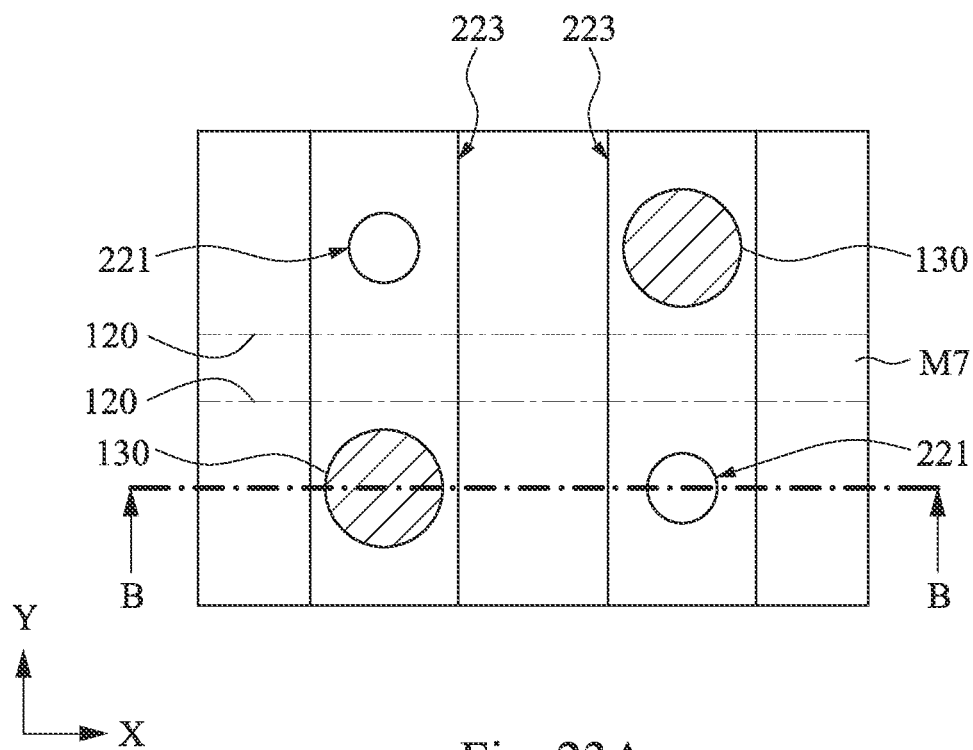
Figure 23B:
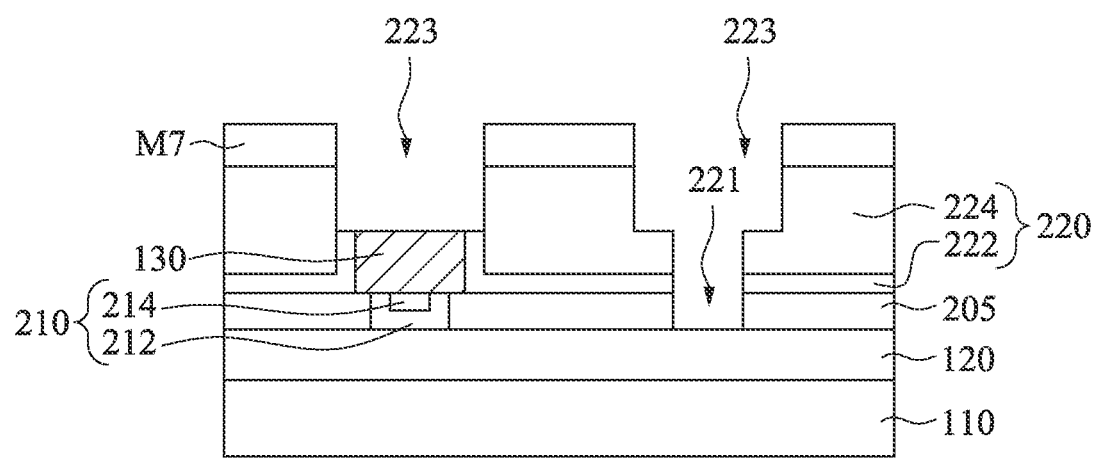

Reference is made to FIGS. 23A and 23B. The patterned mask layer M6 (see FIGS. 22A and 22B) is removed by using stripping, ashing, or etching process (such as reactive ion etching (RIE), ion beam etching (IBE), wet etching, or combinations thereof). Then, another patterned mask layer M7 is formed over the first dielectric structure 220. The patterned mask layer M7 may have the same or similar materials to the patterned mask layer M1 of FIGS. 3A and 3B. The patterned mask layer M7 may have a thickness in a range from about 0.1 nm to about 1000 nm.

Then, a plurality of trenches 223 are formed in the first dielectric structure 220. The first dielectric structure 220 is patterned (etched) using the patterned mask layer M7 as a mask to form the trenches 223 in the first dielectric structure 220. The trenches 223 expose the first MTJ stacks 130.

Figure 24A:
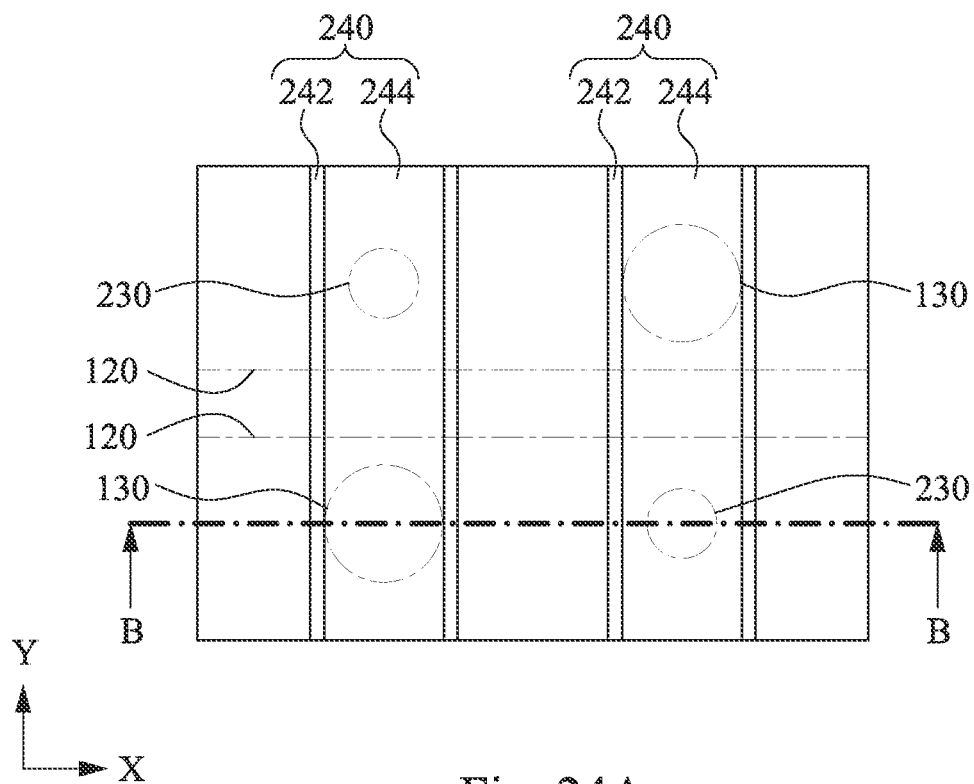
Figure 24B:
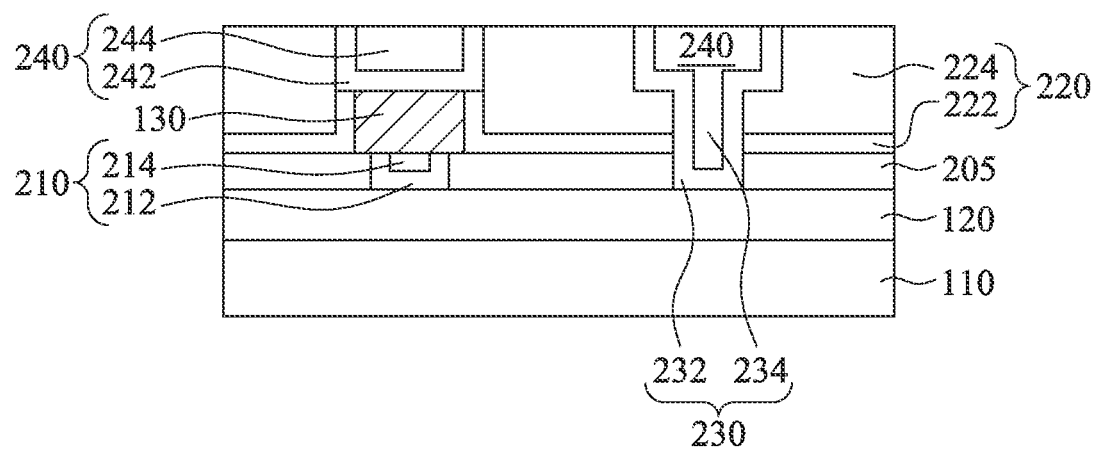

Reference is made to FIGS. 24A and 24B. The patterned mask layer M7 (see FIGS. 23A and 23B) is removed by using stripping, ashing, or etching process (such as reactive ion etching (RIE), ion beam etching (IBE), wet etching, or combinations thereof). Then, barrier layers 232 and 242 are conformally formed in the second openings 221 and the trenches 223. The barrier layers 232 and 242 can improve the adhesion between the first MTJ stacks 130 or the bottom conductive lines 120 and a material formed thereon (such as the filling materials 234 and 244), or prevent a diffusion of a metal from diffusing from the via/line into the first dielectric structure 220 and the first dielectric layer 205. The barrier layers 232 and 242 may have the same or similar materials to the barrier layers 162 of FIG. 8B. The barrier layers 232 and 242 may have a thickness in a range from about 0.1 nm to about 1000 nm.

Filling materials 234 and 244 are respectively formed in the second openings 221 and the trenches 223 (see FIG. 23B). The filling materials 234 and 244 are electrically connected to the first MTJ stacks 130 and the bottom conductive lines 120. The formations of the barrier layers 232 and 242 and the filling materials 234 and 244 are similar to or the same as the formations of the barrier layers 192 and 197 and the filling materials 194 and 199 of FIG. 14B. The filling materials 234 and 244 may have the same or similar materials to the filling material 194 and 199 of FIG. 14B. The filling material 234 and the barrier layer 232 are referred to as the second via 230, and the filling material 244 and the barrier layer 242 are referred to as the middle conductive lines 240.

In FIG. 24A, the bottom conductive lines 120 and the middle conductive lines 240 extend in different directions. For example, the bottom conductive lines 120 extend in the X direction, and the second conductive lines extend in the Y direction. The first MTJ stacks 130 may have similar arrangement to the first MTJ stacks 130 in FIG. 4A. Thus, the description thereof is not repeated herein.

Figure 25A:
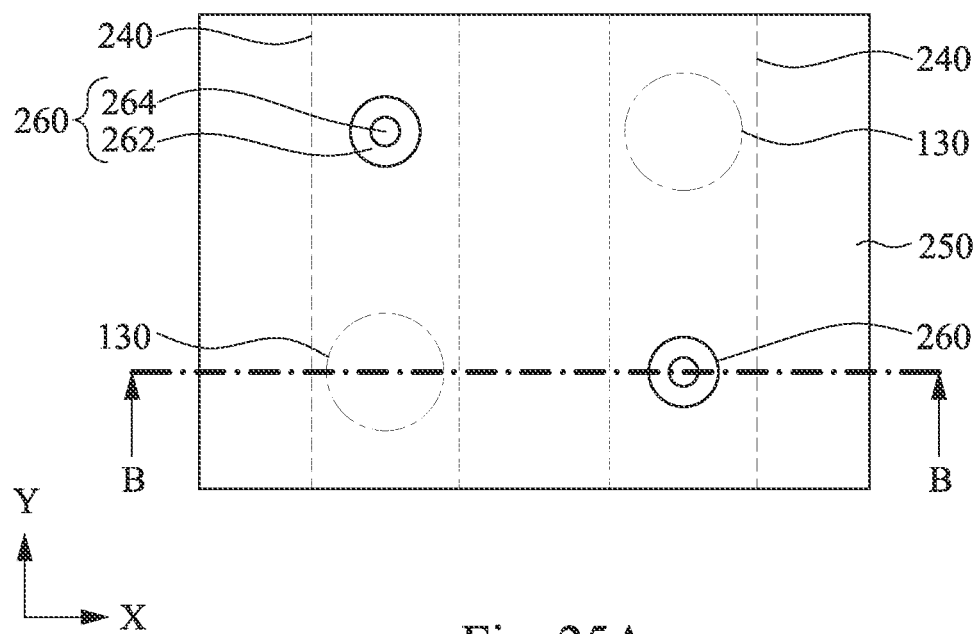
Figure 25B:
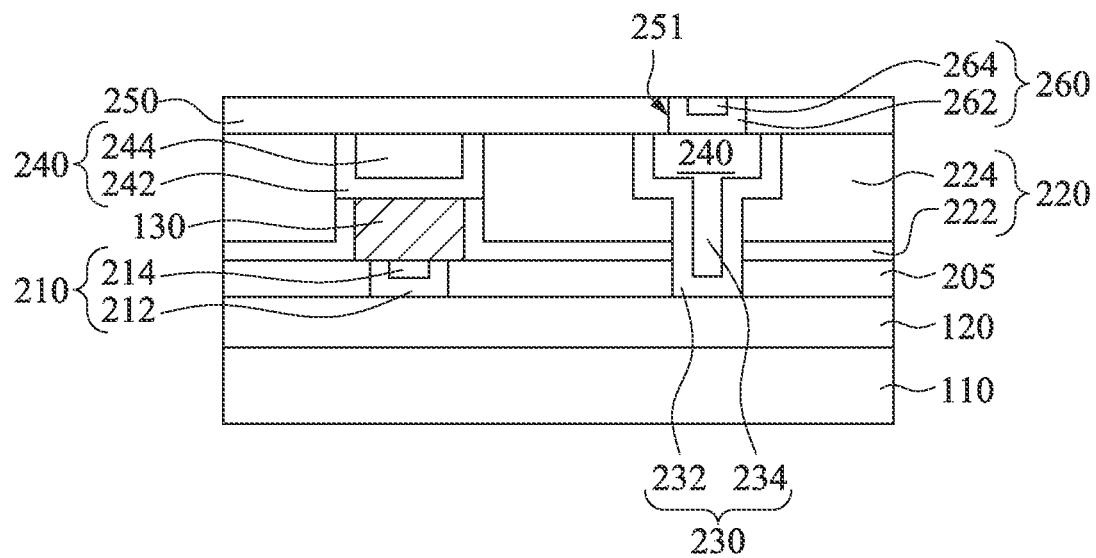

In operation S54 of method M40 in FIG. 17A, a plurality of third vias 260 are formed over the middle conductive lines 240, as shown in FIGS. 25A and 25B. More specific, a third dielectric layer 250 is formed over the first dielectric structure 220 and covers the middle conductive lines 240. The third dielectric layer 250 may have the same or similar materials to the first dielectric layer 154 of FIG. 5B. Then, a plurality of third openings 251 are formed in the first dielectric layer 205. The third openings 251 respectively expose the middle conductive lines 240. Since the formation of the third openings 251 is similar to the formation of the first openings 151 in FIGS. 7A and 7B, a detailed description thereof is not repeated herein.

Subsequently, third vias 260 are respectively formed in the third opening 251. In some embodiments, each of the third vias 260 includes a barrier layer 262 and a filling material 264 over the barrier layer 262. Since the formation of the third vias 260 and the material thereof are similar to the first vias 160 in FIGS. 8A and 8B, a detailed description thereof is not repeated herein.

Figure 26A:
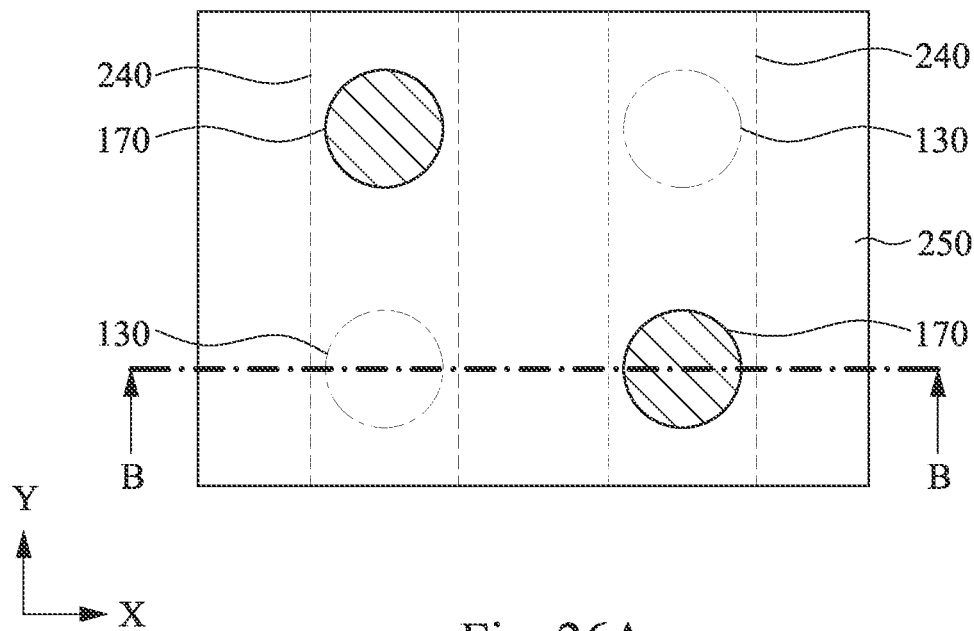
Figure 26B:
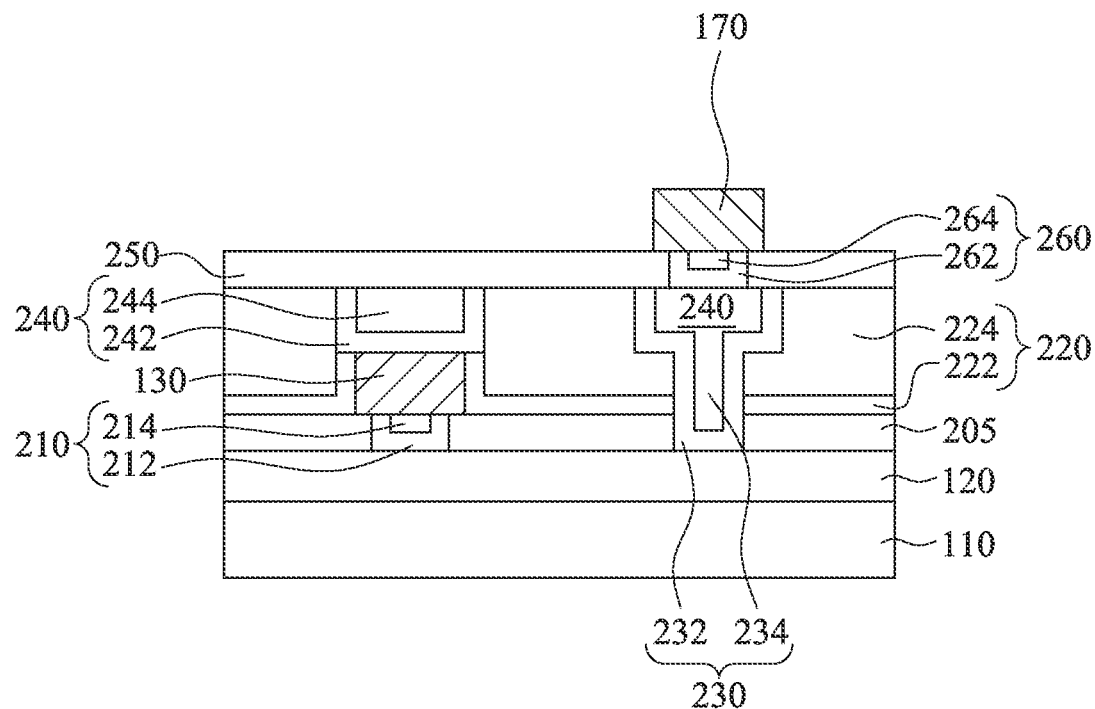

In operation S56 of method M40 in FIG. 17B, a plurality of second MTJ stacks 170 are formed over the third vias 260, as shown in FIGS. 26A and 26B. For example, a MTJ structure (e.g., the MTJ structure in FIG. 15A) may be formed over the third dielectric layer 250 and covers the third vias 260. A patterned mask layer is then formed over the MTJ structure and exposes portions of the MTJ structure. The MTJ structure is subsequently patterned using the patterned mask layer as a mask to form the second MTJ stacks 170, and the patterned mask layer is removed. The second MTJ stacks 170 are respectively formed over the third vias 260. In other words, the second MTJ stacks 170 are electrically connected to the middle conductive lines 240 respectively through the third vias 260. In FIG. 26A, the first MTJ stacks 130 and the second MTJ stacks 170 may have similar arrangement to the first MTJ stacks 130 and the second MTJ stacks 170 in FIG. 10A. Thus, the description thereof is not repeated herein.

In operation S58 of method M40 in FIG. 17B, a second dielectric structure 270 is formed over the second MTJ stacks 170, as shown in FIGS. 27A, 27B, 28A, and 28B.

Figure 27A:
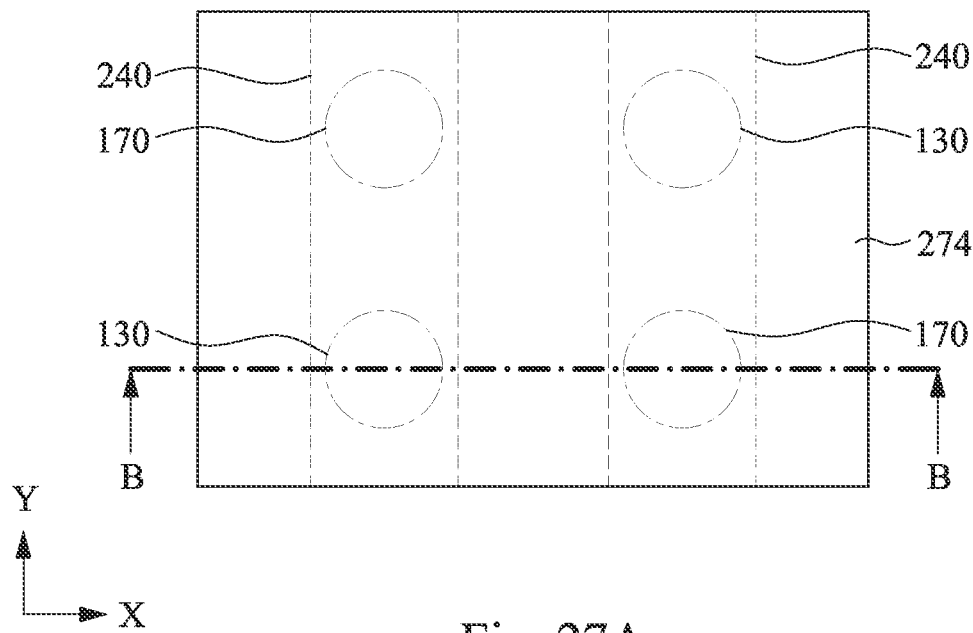
Figure 27B:
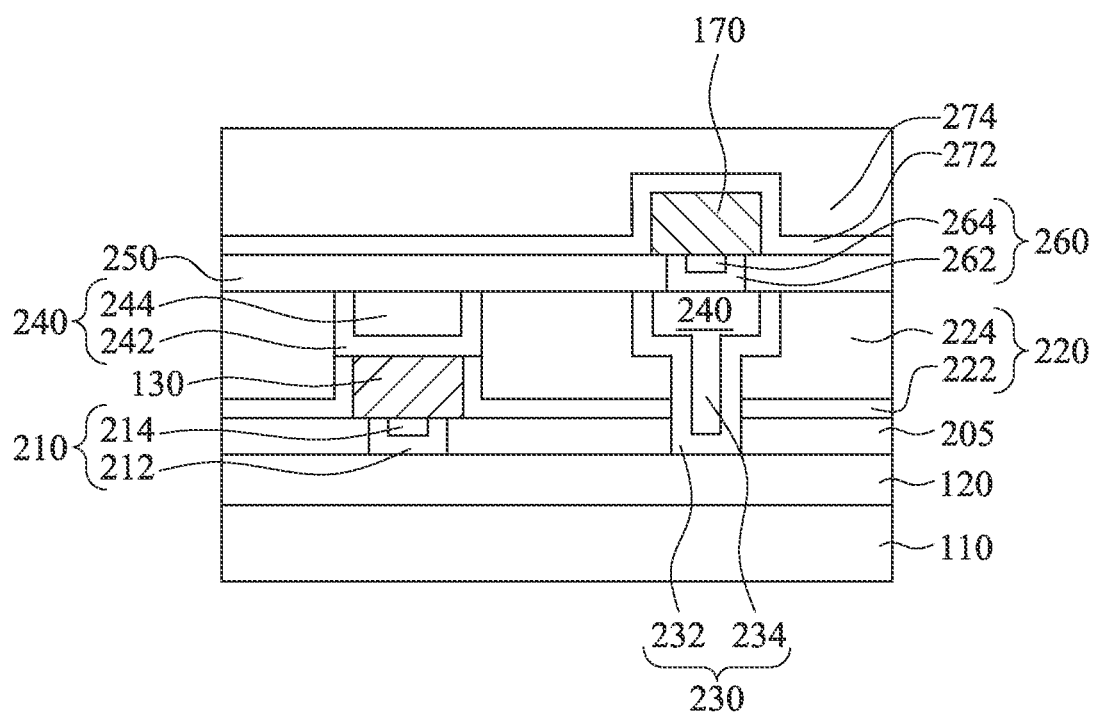

Reference is made to FIGS. 27A and 27B. A second encapsulation layer 272 is formed over the second MTJ stacks 170 and the middle conductive lines 240, lining the upper surface and sidewalls of the second MTJ stacks 170. In some embodiments, the second encapsulation layer 272 may be formed by suitable deposition technique and may be formed conformally. Further, the second encapsulation layer 272 may have the same or similar materials to the first encapsulation layer 152 of FIG. 5B. The second encapsulation layer 272 may have a thickness in a range from about 0.1 nm to about 1000 nm.

Then, a fourth dielectric layer 274 is formed over the second encapsulation layer 272 and covers the second MTJ stacks 170. The fourth dielectric layer 274 may have the same or similar materials to the first dielectric layer 154 of FIG. 5B. The fourth dielectric layer 274 may have a thickness in a range from about 0.1 nm to about 1000 nm.

Figure 28A:
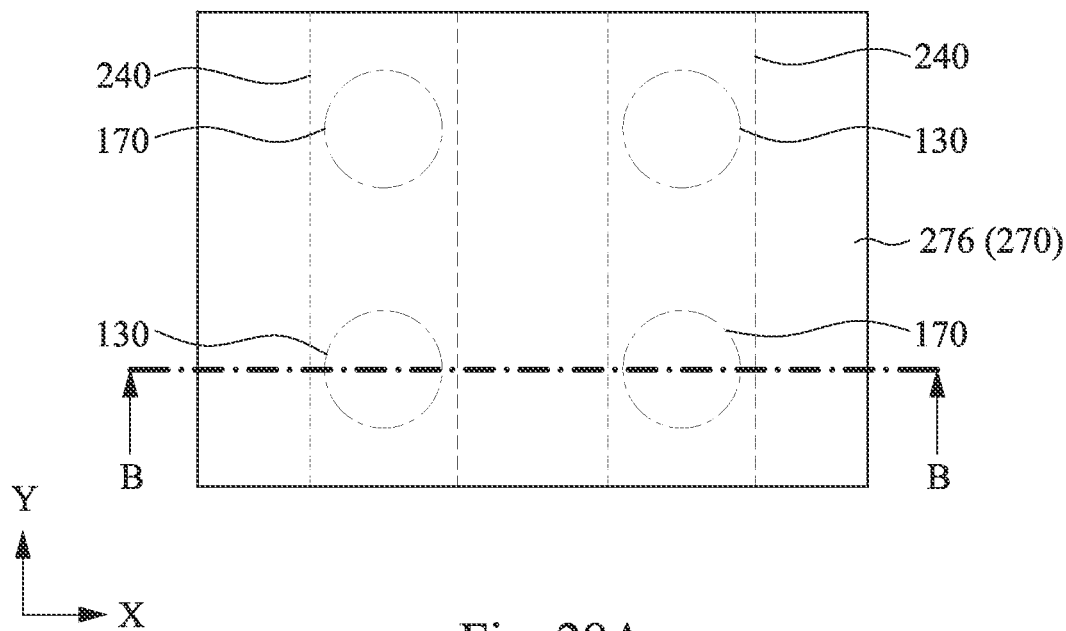
Figure 28B:
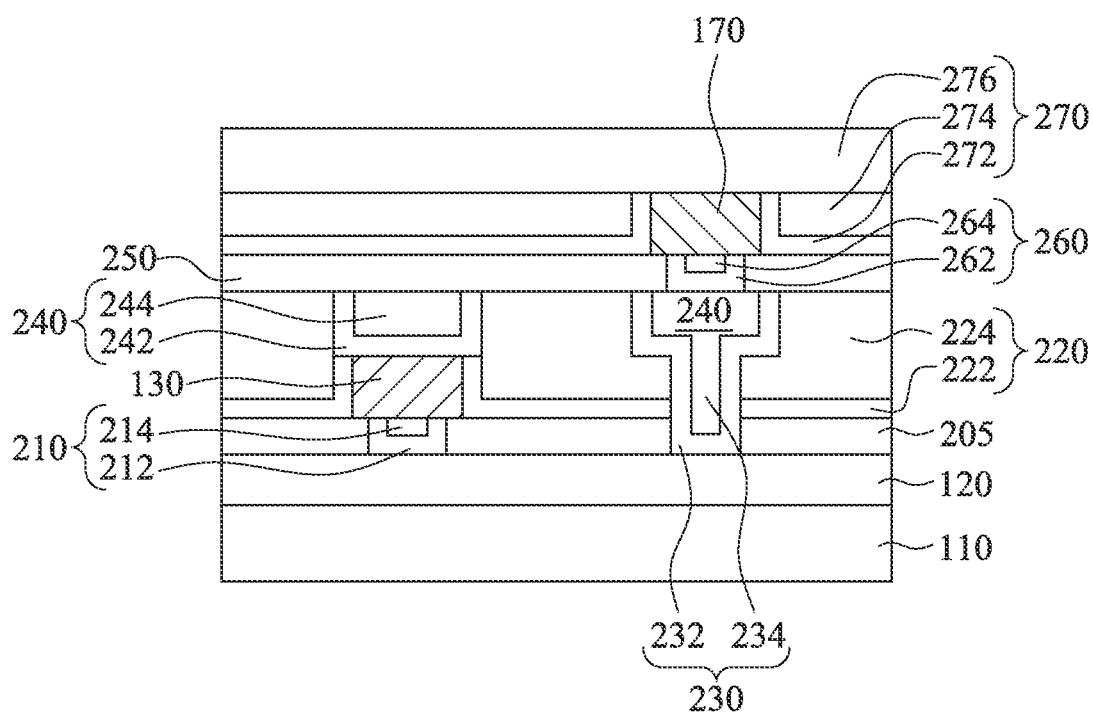

Reference is made to FIGS. 28A and 28B. A planarization process is performed to the fourth dielectric layer 274 and the second encapsulation layer 272 until top surfaces of the second MTJ stacks 170 are exposed. For example, the planarization process is a CMP process.

Then, a fifth dielectric layer 276 is formed over the second encapsulation layer 272 and the fourth dielectric layer 274, and covers the second MTJ stacks 170. The fifth dielectric layer 276 may have the same or similar materials to the first dielectric layer 154 of FIG. 5B. The fifth dielectric layer 276 may have a thickness in a range from about 0.1 nm to about 1000 nm. The fifth dielectric layer 276, the fourth dielectric layer 274, and the second encapsulation layer 272 are together referred to as the second dielectric structure 270.

Figure 29A:
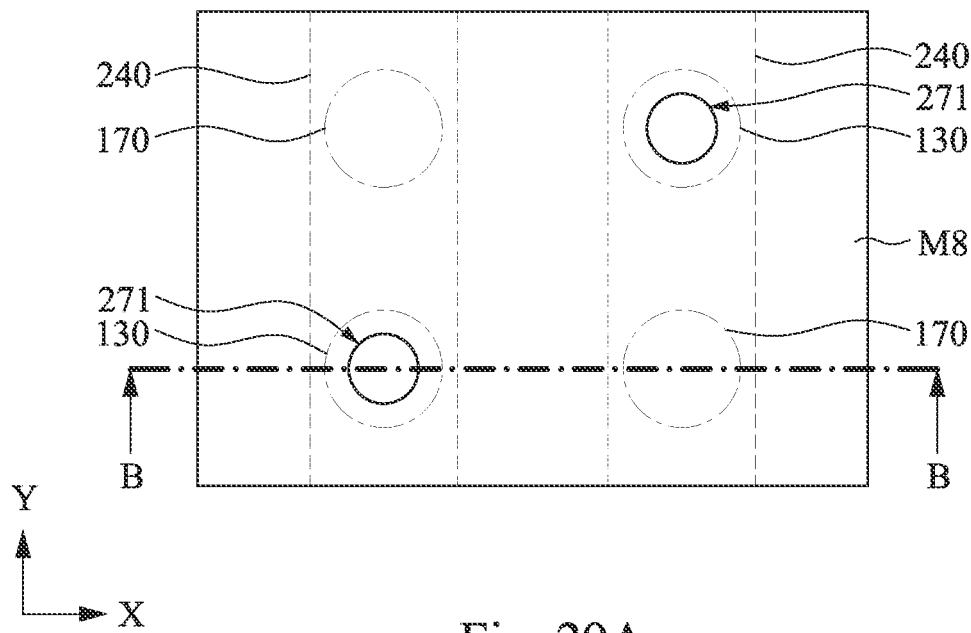
Figure 29B:
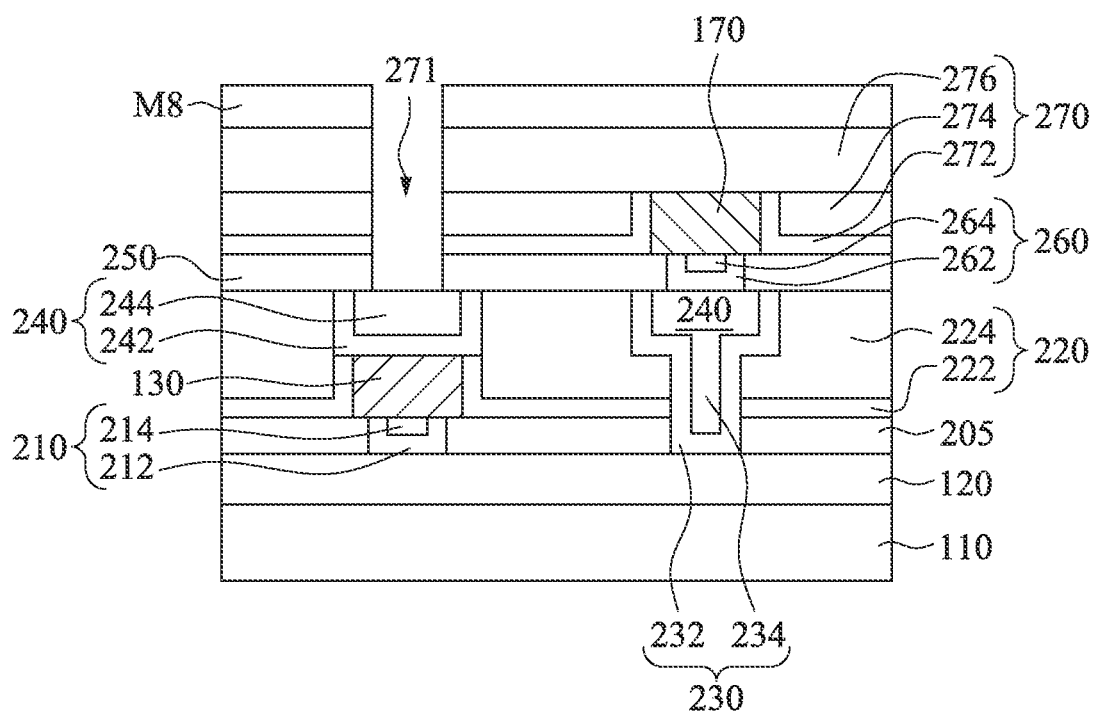

In operation S60 of method M40 in FIG. 17B, a plurality of fourth vias 280 and a plurality of top conductive lines 290 are formed in the second dielectric structure 270, as shown in FIGS. 29A, 29B, 30A, 30B, 31A, and 31B. Reference is made to FIGS. 29A and 29B. Another patterned mask layer M8 is formed over the second dielectric structure 270. The patterned mask layer M8 may have the same or similar materials to the patterned mask layer M1 of FIGS. 3A and 3B. The patterned mask layer M8 may have a thickness in a range from about 0.1 nm to about 1000 nm.

Then, a plurality of fourth openings 271 are formed in the second dielectric structure 270. The second dielectric structure 270 is patterned (etched) using the patterned mask layer M8 as a mask to form the fourth openings 271 in the second dielectric structure 270. The fourth openings 271 respectively expose portions of the middle conductive lines 240.

Figure 30A:
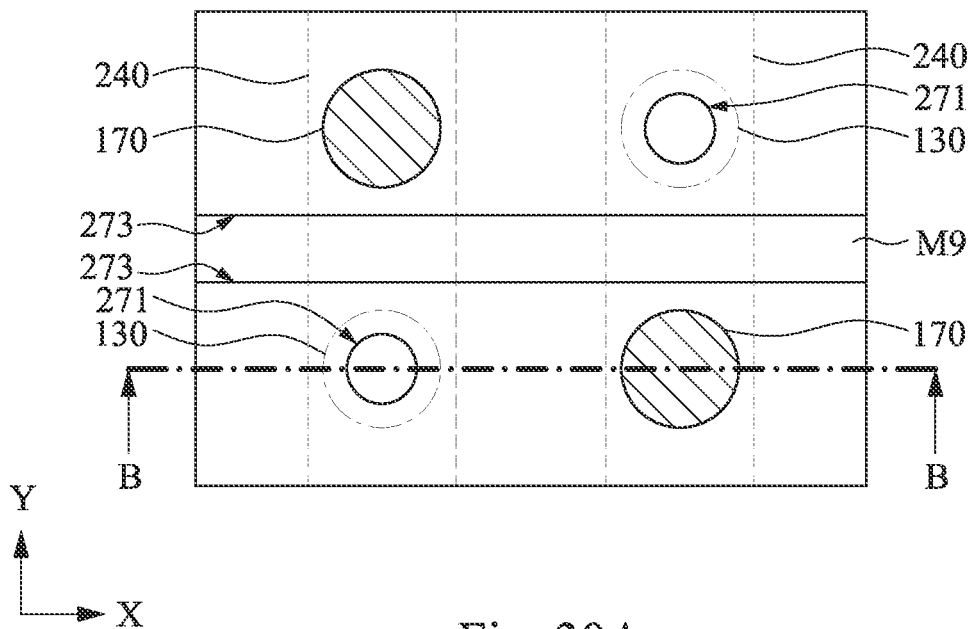
Figure 30B:
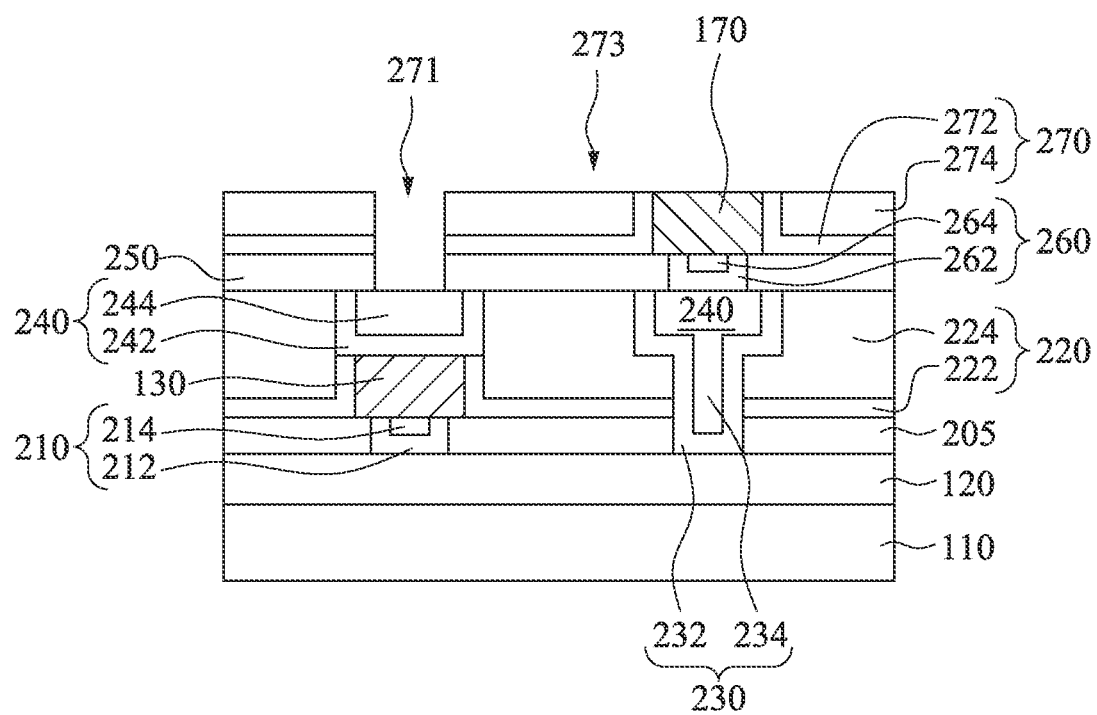

Reference is made to FIGS. 30A and 30B. The patterned mask layer M8 (see FIGS. 29A and 29B) is removed by using stripping, ashing, or etching process (such as reactive ion etching (RIE), ion beam etching (IBE), wet etching, or combinations thereof). Then, another patterned mask layer M9 is formed over the second dielectric structure 270. The patterned mask layer M9 may have the same or similar materials to the patterned mask layer M1 of FIGS. 3A and 3B. The patterned mask layer M9 may have a thickness in a range from about 0.1 nm to about 1000 nm.

Then, a plurality of trenches 273 are formed in the second dielectric structure 270. The second dielectric structure 270 is patterned (etched) using the patterned mask layer M9 as a mask to form the trenches 273 in the second dielectric structure 270. The trenches 273 expose the second MTJ stacks 170.

Figure 31A:
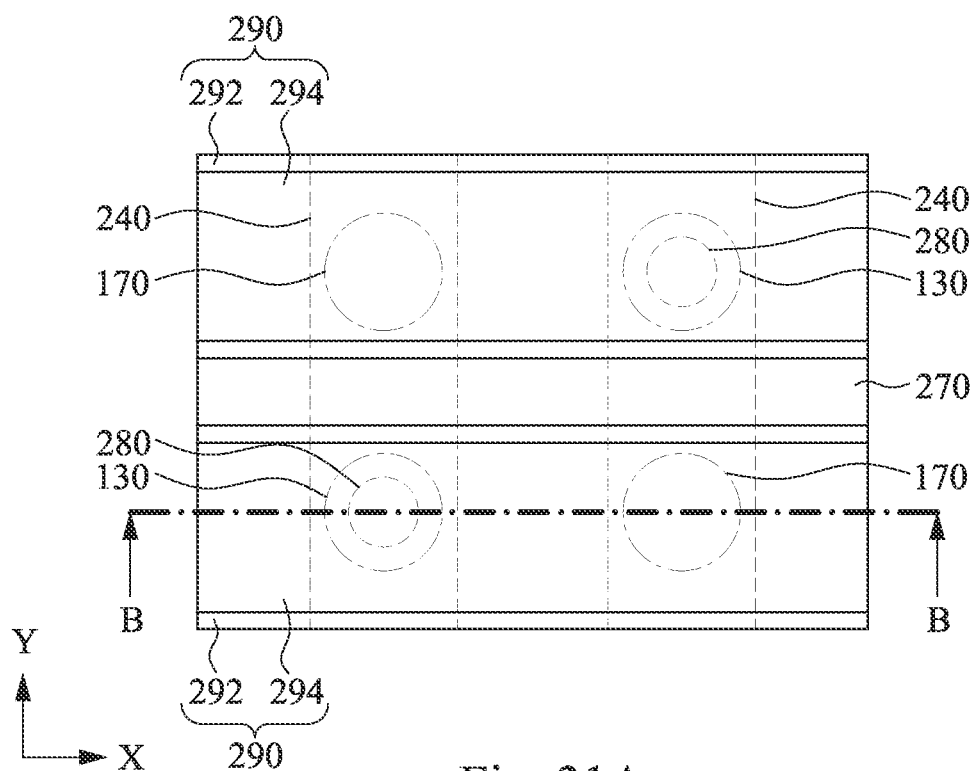
Figure 31B:
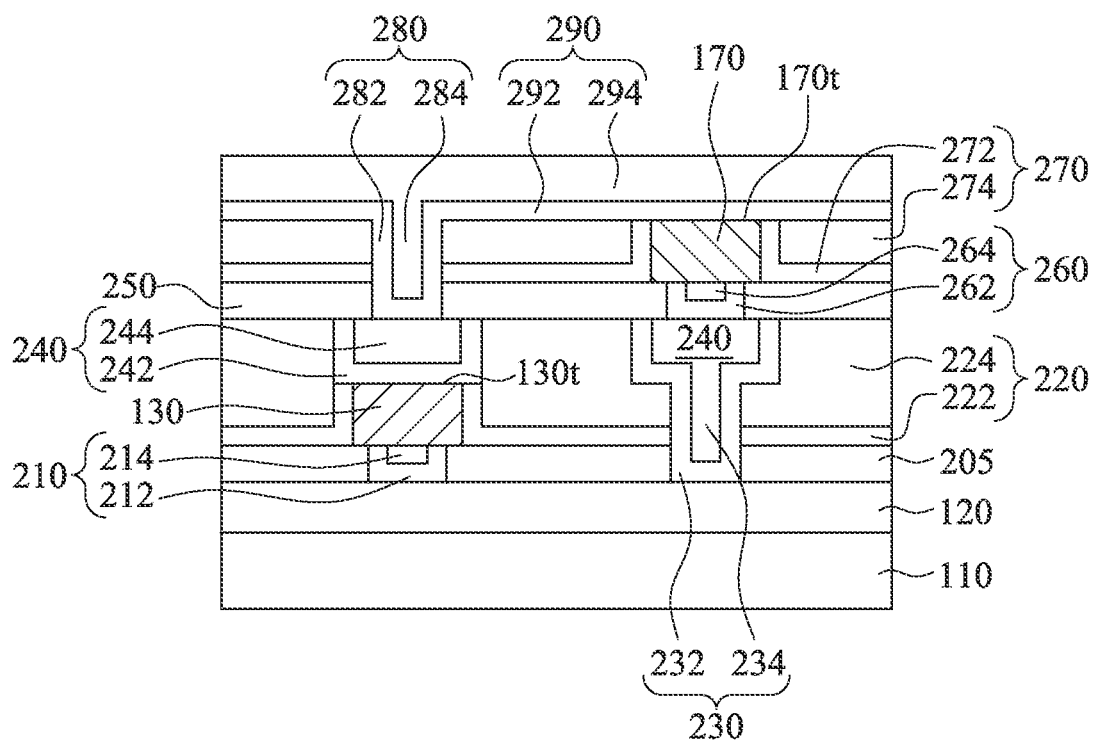

Reference is made to FIGS. 31A and 31B. The patterned mask layer M9 (see FIG. 31A) is removed by using stripping, ashing, or etching process (such as reactive ion etching (RIE), ion beam etching (IBE), wet etching, or combinations thereof). Then, barrier layers 282 and 292 are conformally formed in the fourth openings 271 and the trenches 273. The barrier layers 282 and 292 can improve the adhesion between the second MTJ stacks 170 or the middle conductive lines 240 and a material formed thereon (such as the filling materials 284 and 294), or prevent a diffusion of a metal from diffusing from the via/line into the second dielectric structure 270. The barrier layers 282 and 292 may have the same or similar materials to the barrier layers 162 of FIG. 8B. The barrier layers 282 and 292 may have a thickness in a range from about 0.1 nm to about 1000 nm.

Filling materials 284 and 294 are respectively formed in the fourth openings 271 and the trenches 273 (see FIGS. 30A and 30B). The filling materials 284 and 294 are electrically connected to the second MTJ stacks 170 and the middle conductive lines 240. The formations of the barrier layers 282 and 292 and the filling materials 284 and 294 are similar to or the same as the formations of the barrier layers 192 and 197 and the filling materials 194 and 199 of FIG. 14B. The filling materials 284 and 294 may have the same or similar materials to the filling material 194 and 199 of FIG. 14B. The filling material 284 and the barrier layer 282 are referred to as the fourth via 280, and the filling material 294 and the barrier layer 292 are referred to as the top conductive lines 290.

In FIG. 31A, the top conductive lines 290 and the middle conductive lines 240 extend in different directions. For example, the top conductive lines 290 extend in the X direction, and the middle conductive lines 240 extend in the Y direction. In some embodiments, the top conductive lines 290 and the bottom conductive lines 120 extend in the same direction (e.g., the X direction in this case). Further, one of the top conductive lines 290 is electrically connected to one first MTJ stack 130 and one second MTJ stack 170, where these first MTJ stack 130 and second MTJ stack 170 are arranged along the Y direction.

Figure 32:
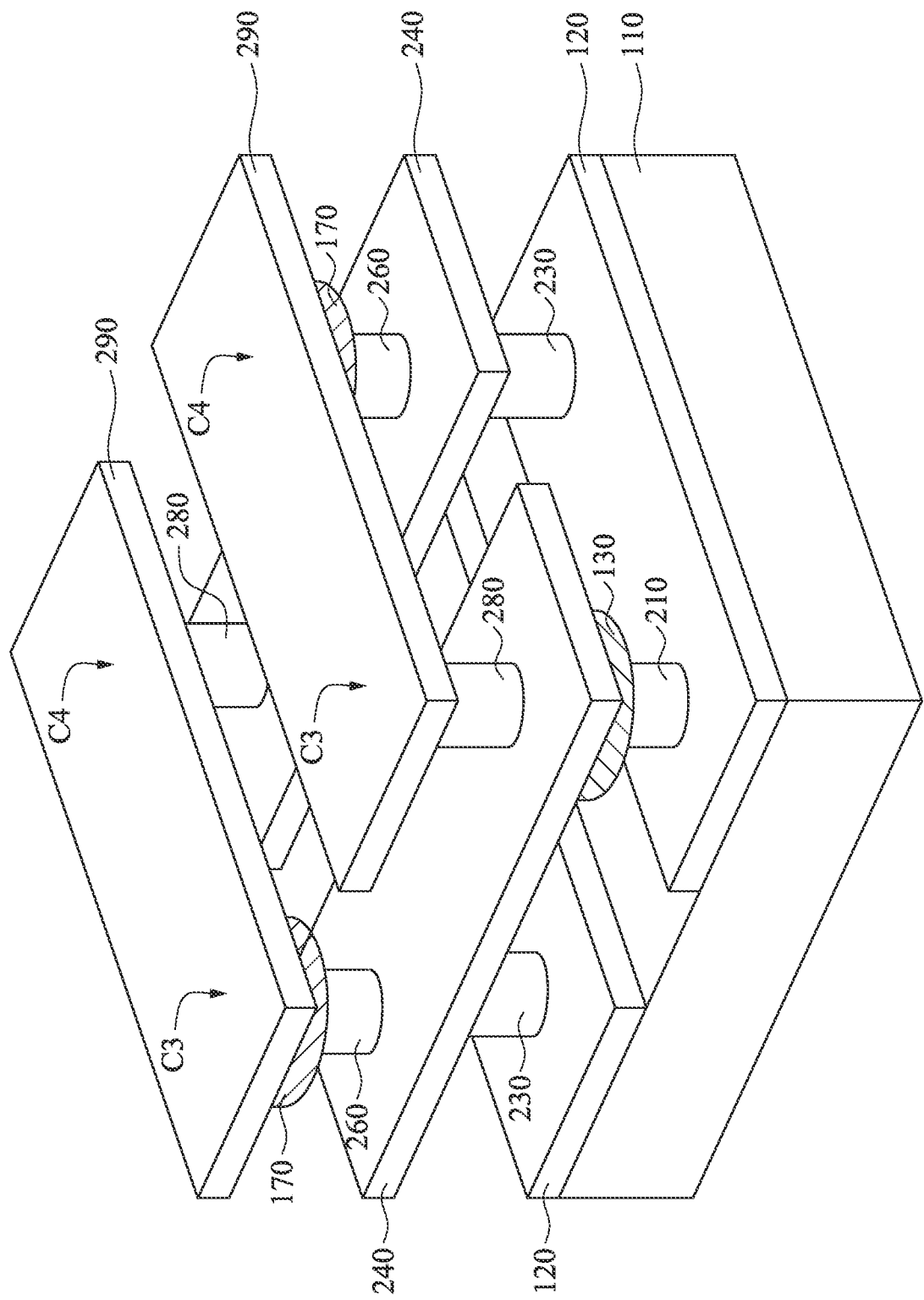
FIG. 32 is a perspective view of the memory device in FIGS. 31A and 31B in accordance with various embodiments of the present disclosure.

FIG. 32 is a perspective view of the memory device in FIGS. 31A and 31B in accordance with various embodiments of the present disclosure. The dielectric materials (such as the first dielectric layer 205, the first dielectric structure 220, the third dielectric layer 250, and the second dielectric structure 270 in FIG. 31B) are omitted in FIG. 32 for clarity. Also, the barrier layers in the vias and or conductive lines are not shown in FIG. 32 for clarity. The memory device includes a plurality of bottom conductive lines 120, a plurality of first MTJ stacks 130, a plurality of middle conductive lines 240, a plurality of second MTJ stacks 170, and a plurality of top conductive lines 290. The bottom conductive lines 120 are disposed over a wafer 110. The first MTJ stacks 130 are respectively disposed over the bottom conductive lines 120. In some embodiments, the first MTJ stacks 130 are electrically connected to the bottom conductive lines 120 respectively through first vias 210. The middle conductive lines 240 are disposed over the first MTJ stacks 130. In some embodiments, the first MTJ stacks 130 are respectively in contact with the middle conductive lines 240. The second MTJ stacks 170 are at a different level from the first MTJ stacks 130 and disposed over the middle conductive lines 240. The top surface 170t of the second MTJ stack 170 is higher than the top surface 130b of the first MTJ stack 130 (see FIG. 31B). The second MTJ stacks 170 are electrically connected to the middle conductive lines 240 respectively through third vias 260. The top conductive lines 290 are disposed over the first MTJ stacks 130 and the second MTJ stacks 170. In some embodiments, the second MTJ stacks 170 are respectively in contact with the top conductive lines 290. In some embodiments, second vias 230 are formed between the bottom conductive lines 120 and the middle conductive lines 240 to interconnect the second MTJ stack 170 and the bottom conductive line 120. In some embodiments, fourth vias 280 are formed between the top conductive lines 290 and the middle conductive lines 240 to interconnect the first MTJ stack 130 and the top conductive line 290.

The first MTJ stack 130, the first via 210, and the fourth via 280 form a memory cell C3, and the second MTJ stack 170, the second via 230, and the third via 260 form another memory cell C4. The memory cells C3 and C4 are alternately arranged. The two memory cells C3 and C4 are adjacent to each other but the MTJ stacks thereof are at different levels. For example, in FIG. 32, the second MTJ stack 170 is at a level higher than the first MTJ stack 130. More specific, the first MTJ stacks 130 are between the bottom conductive lines 120 and the middle conductive lines 240, and the second MTJ stacks 170 are between the middle conductive lines 240 and the top conductive lines 290. With this configuration, the memory cell C3 may be close to the memory cell C4 (e.g., the first MTJ stack 130 and the second MTJ stack 170 may overlap with each other in a top view), and the layout area of the memory device can be reduced.

Figure 33:
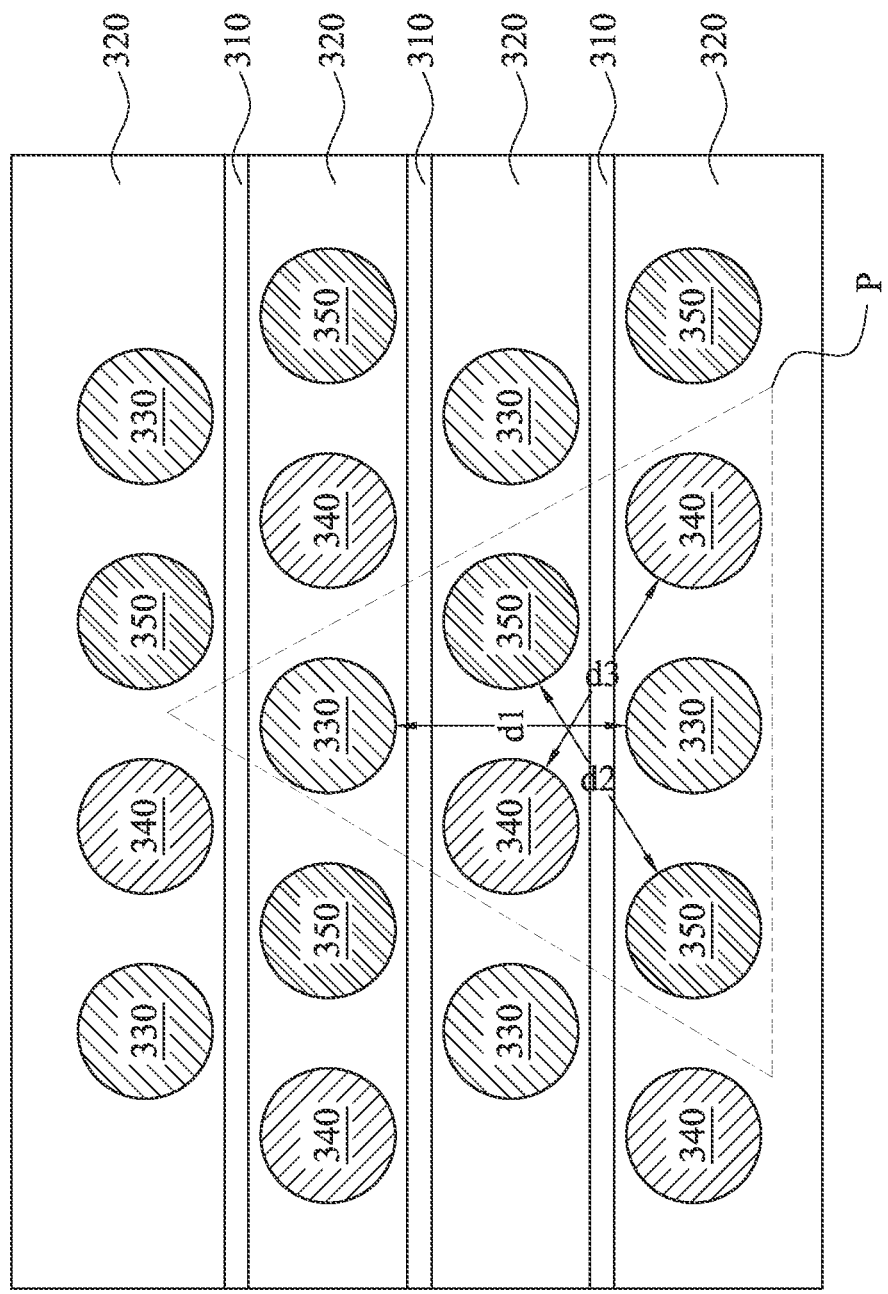
FIG. 33 is a top view of the memory device in accordance with various embodiments of the present disclosure.
Figure 34:
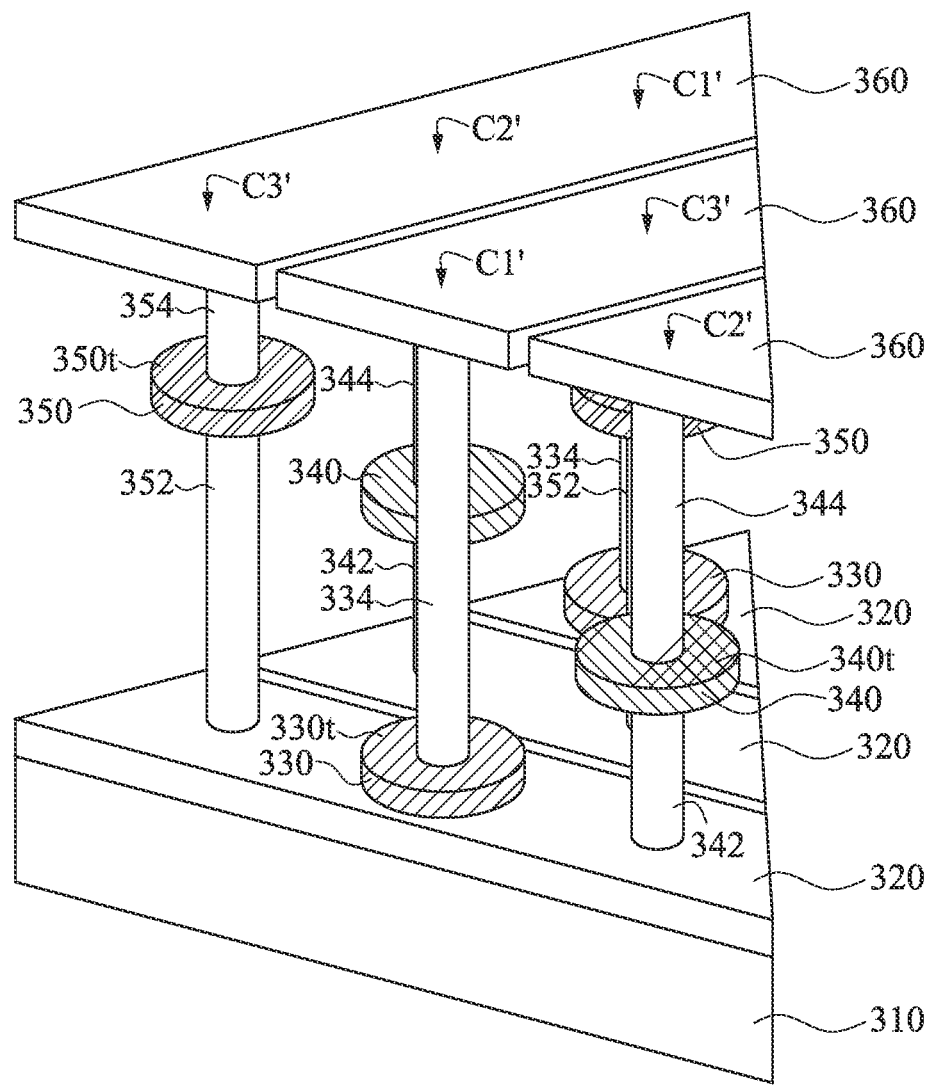
FIG. 34 is a perspective view of an area P of FIG. 33 in accordance with various embodiments of the present disclosure.

FIG. 33 is a top view of the memory device in accordance with various embodiments of the present disclosure, and FIG. 34 is a perspective view of an area P of FIG. 33 in accordance with various embodiments of the present disclosure. For clarity, top conductive lines 360 FIG. 34 are not shown in FIG. 33. The memory device includes a plurality of bottom conductive lines 320, a plurality of first MTJ stacks 330, a plurality of second MTJ stacks 340, a plurality of third MTJ stacks 350, and a plurality of top conductive lines 360.

The bottom conductive lines 320 are disposed over a wafer 310 which may have the same or similar to the wafer 110 of FIGS. 2A and 2B. The first MTJ stacks 330, the second MTJ stacks 340, and the third MTJ stacks 350 are disposed over the bottom conductive lines 320. The first MTJ stacks 330, the second MTJ stacks 340, and the third MTJ stacks 350 are at different levels. For example, a top surface 350t of the third MTJ stack 350 is higher than a top surface 340t of the second MTJ stack 340, and the top surface 340t of the second MTJ stack 340 is higher than a top surface 330t of the first MTJ stack 330. In some embodiments, the first MTJ stacks 330 may be in contact with the bottom conductive lines 320 as shown in FIG. 34. In some other embodiments, the first MTJ stacks 330 are electrically connected to the bottom conductive lines 320 through via(s). The first MTJ stacks 330 may be electrically connected to the top conductive lines 360 through vias 334. The second MTJ stacks 340 are higher than the first MTJ stacks 330. In some embodiments, the second MTJ stacks 340 are electrically connected to the bottom conductive lines 320 through vias 342 and to the top conductive lines 360 through vias 344. The third MTJ stacks 350 are higher than the first MTJ stacks 330 and the second MTJ stacks 340. In some embodiments, the third MTJ stacks 350 are electrically connected to the bottom conductive lines 320 through vias 352 and to the top conductive lines 360 through vias 354. In some embodiments, the bottom conductive lines 320 and the top conductive lines 360 are not parallel. The bottom conductive lines 320 and the top conductive lines 360 extend in different directions. An angle may be formed between extension directions of the bottom conductive lines 320 and the top conductive lines 360, and the angle may be in a range of about 50 degrees to about 70 degrees, e.g., about 60 degrees.

The first MTJ stack 330 and the via 334 form a memory cell C1', the second MTJ stack 340 and the vias 342 and 344 form a memory cell C2', and the third MTJ stack 350 and the vias 352 and 354 form a memory cell C3'. The memory cells C1', C2', and C3' are alternately arranged and form a honeycomb shape in a top view (see FIG. 33). The density of the memory cells depends on the distance between two MTJ stacks at the same level. For example, in FIG. 33, a distance d1 is between the first MTJ stacks 330, a distance d2 is between the second MTJ stacks 340, and a distance d3 is between the third MTJ stacks 350. Since the distances d1, d2, and d3 can be small (as long as greater than the lithography limitation), the first MTJ stacks 330, the second MTJ stacks 340, and the third MTJ stacks 350 may overlap with each other in the top view. Moreover, the memory cells C1', C2', and C3' have substantially the same height. That is, a total height of the first MTJ stack 330 and the via 334, a total height of the second MTJ stack 340 and the vias 342 and 344, and a total height of the third MTJ stack 350 and the vias 352 and 354 may be substantially the same.

The bottom conductive lines 320 may have the same or similar materials to the bottom conductive lines 120 in FIG. 14B. The top conductive lines 360 may have the same or similar materials to the top conductive lines 195 in FIG. 14B. The first MTJ stacks 330, the second MTJ stacks 340, and the third MTJ stacks 350 may have the same or similar materials to the first MTJ stacks 130 and/or the second MTJ stacks 170 in FIG. 14B.

The MTJ stacks in FIGS. 16 and 32 are at two levels, and the MTJ stacks in FIG. 34 are at three levels. In some other embodiments, however, the MTJ stacks may be distributed in N levels, where N is greater than 3. Furthermore, some of the MTJ stacks may be between n and n+1 conductive lines, and some other of the MTJ stacks may be between m and m+1 conductive lines, where n is equal to m or not equal to m.

Figure 35:
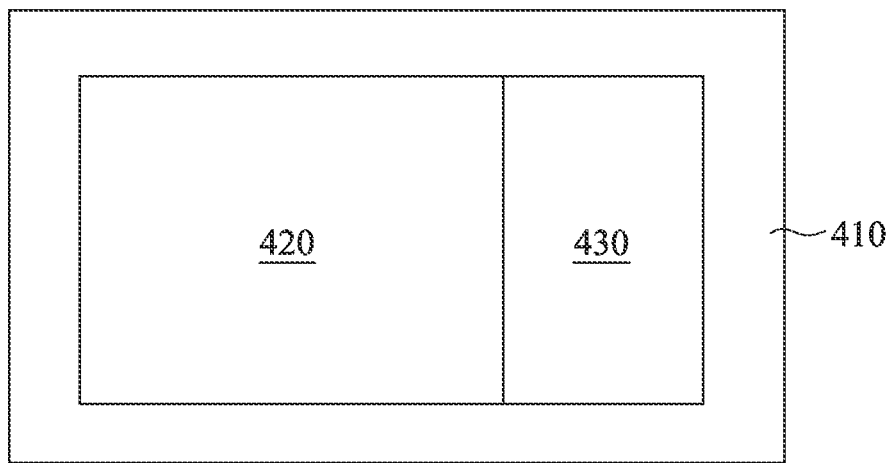
FIG. 35 is a top view of a memory device in accordance with various embodiments of the present disclosure.

FIG. 35 is a top view of a memory device in accordance with various embodiments of the present disclosure. The memory device includes a wafer 410, a memory structure 420, and a logic device 430. The wafer 410 may be a substrate, and the memory structure 420 and the logic device 430 are disposed over the wafer 410. The memory structure 420 includes a plurality of memory cells C1, C2 (see FIG. 16), C3, C4 (see FIG. 32), C1', C2', C3' (see FIG. 34), or combinations thereof. The logic device 430 is electrically connected to the memory structure 420 to operate the memory cells in the memory structure 420. Various logic circuitry, such as row and column decoders and/or sense amplifiers, can be included in the logic device 430. The logic device 430 may further include other logic such as counters, clock circuits, processing circuits, and/or input/output circuitry such as buffers and drivers. In this case, the memory cells of the memory structure 420 are stand-alone memories.

Figure 36:
FIG. 36 is a top view of a memory device in accordance with various embodiments of the present disclosure.

FIG. 36 is a top view of a memory device in accordance with various embodiments of the present disclosure. The memory device includes a wafer 510 and a memory structure 520 over the wafer 510. The wafer 510 includes a plurality of (access) transistors and an inter-metal dielectric (IMD) layer over the transistors. In some embodiments, the transistor may be planar MOSFET, BJT, FinFET, or gate-all-around FET (GAAFET). The IMD layer interconnects the transistors and the memory cells in the memory structure 520. As such, the memory cell is referred to as an embedded memory and memory device has one-transistor-one-MTJ memory configuration. In some other embodiments, the memory structure 520 is in the IMD layer. Some levels of the IMD layer are configured to interconnect the memory cells and the transistors, and some other levels of the IMD layer are configured to form the memory cells. The memory cells may be formed in arbitrary levels of the IMD layer. The memory structure 420 includes a plurality of memory cells C1, C2 (see FIG. 16), C3, C4 (see FIG. 32), C1', C2', C3' (see FIG. 34), or combinations thereof. Therefore, the memory structure 420 may have a smaller layout area than the layout area 515 of the transistors. As such, a portion of the area M above the transistors may be available for other circuits or devices to be formed.

Based on the above discussions, it can be seen that the present disclosure offers advantages. It is understood, however, that other embodiments may offer additional advantages, and not all advantages are necessarily disclosed herein, and that no particular advantage is required for all embodiments. One advantage is that the MTJ stacks of adjacent memory cells are at different levels (or vertically staggered), such that the memory cells can be close to each other, and the layout area of the memory cells can be reduced. Another advantage is that the MTJ stacks may be formed in different levels of the IMD layer. As such, it is more flexible to design the position of the memories.

According to some embodiments, a method includes forming bottom conductive lines over a wafer. A first magnetic tunnel junction (MTJ) stack is formed over the bottom conductive lines. Middle conductive lines are formed over the first MTJ stack. A second MTJ stack is formed over the middle conductive lines. Top conductive lines are formed over the second MTJ stack.

According to some embodiments, a method includes forming bottom conductive lines over a substrate; forming a first magnetic tunnel junction (MTJ) stack over the bottom conductive lines and electrically connected to one of the bottom conductive lines; forming a first dielectric structure over the bottom conductive lines and covering the first MTJ stack; forming a first via in the first dielectric structure and in contact with the one of the bottom conductive lines; forming a second magnetic tunnel junction (MTJ) stack over the first dielectric structure and electrically connected to the first via; forming a second dielectric structure over the first dielectric structure and covering the second MTJ stack; and forming a second via in the first and second dielectric structures and in contact with the first MTJ stack.

According to some embodiments, a method includes forming first and second bottom conductive lines over a substrate and extending along a first direction; forming a first MTJ stack over the first bottom conductive line; forming a first via over the first bottom conductive line after forming the first MTJ stack, wherein the first MTJ stack and the first via are arranged along the first direction; forming a second MTJ stack over the second bottom conductive line after forming the first via, wherein the second MTJ stack and the first MTJ stack are arranged along a second direction perpendicular to the first direction; and forming a second via over the second bottom conductive line after forming the second MTJ stack, wherein the second via and the second MTJ stack are arranged along the first direction.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device, comprising:
    bottom conductive lines extending along a first direction;
    top conductive lines above the bottom conductive lines and extending along a second direction different from the first direction;
    a first memory cell vertically between one of the bottom conductive lines and one of the top conductive lines;
    a second memory cell vertically between the one of the bottom conductive lines and another one of the top conductive lines;
    a third memory cell vertically between another one of the bottom conductive lines and the one of the top conductive lines; and
    a fourth memory cell vertically between the another one of the bottom conductive lines and the another one of the top conductive lines, wherein the first memory cell and the fourth memory cell are at a first level, and the second memory cell and the third memory cell are at a second level higher than the first level, and wherein the first memory cell is in direct contact with the one of the bottom conductive lines, and the fourth memory cell is in direct contact with the another one of the bottom conductive lines.

2. The memory device of claim 1, wherein the first memory cell and the second memory cell are arranged along the first direction.

3. The memory device of claim 1, wherein the first direction is substantially perpendicular to the second direction.

4. The memory device of claim 1, wherein the first memory cell is aligned with the second memory cell along the first direction and the first memory cell is aligned with the third memory cell along the second direction, and wherein the first direction is substantially perpendicular to the second direction.

5. The memory device of claim 1, wherein the second memory cell is in direct contact with the another one of the top conductive lines, and the third memory cell is in direct contact with the one of the top conductive lines.

6. The memory device of claim 1, further comprising:
    a first via connecting the first memory cell to the one of the top conductive lines;
    a second via connecting the second memory cell to the one of the bottom conductive lines;
    a third via connecting the third memory cell to the another one of the bottom conductive lines; and
    a fourth via connecting the fourth memory cell to the another one of the top conductive lines.

7. The memory device of claim 1, wherein the one of the top conductive lines vertically overlaps the first memory cell and the third memory cell.

8. The memory device of claim 7, wherein the another one of the top conductive lines vertically overlaps the second memory cell and the fourth memory cell.

9. The memory device of claim 1, further comprising a first dielectric structure laterally surrounding the first memory cell and the fourth memory cell.

10. The memory device of claim 9, further comprising a second dielectric structure above the first dielectric structure and laterally surrounding the second memory cell and the third memory cell.

11. A memory device, comprising:
    bottom conductive lines extending along a first direction;

a first memory cell in contact with one of the bottom conductive lines;

a first via in contact with another one of the bottom conductive lines;

a second via in contact with the first memory cell;

a second memory cell in contact with the first via;

top conductive lines extending along a second direction different from the first direction, wherein the second memory cell and the second via both are in contact with one of the top conductive lines;

a third memory cell vertically between the one of the bottom conductive lines and another one of the top conductive lines, wherein the second memory cell is in direct contact with the one of the top conductive lines, and the third memory cell is in direct contact with the another one of the top conductive lines; and a fourth memory cell vertically between the another one of the bottom conductive lines and the another one of the top conductive lines, wherein the first memory cell and the fourth memory cell are at a first level, and the second memory cell and the third memory cell are at a second level higher than the first level.

12. The memory device of claim 11, wherein the first direction is perpendicular to the second direction.

13. The memory device of claim 11, further comprising a first dielectric structure surrounding the first memory cell and the second via, wherein the first dielectric structure comprising:

a first dielectric layer;

a first encapsulation layer lining a sidewall and a bottom surface of the first dielectric layer; and a second dielectric layer over the first dielectric layer.

14. The memory device of claim 13, further comprising a second dielectric structure surrounding the second memory cell and the first via, wherein the second dielectric structure comprising:

a third dielectric layer; and a second encapsulation layer lining a sidewall and a bottom surface of the third dielectric layer.

15. The memory device of claim 11, wherein the first memory cell is in direct contact with the one of the bottom conductive lines, and the fourth memory cell is in direct contact with the another one of the bottom conductive lines.

16. A memory device, comprising:

a bottom conductive line extending along a first direction;

a middle conductive line above the bottom conductive line and extending along a second direction perpendicular to the first direction;

a top conductive line above the middle conductive line and extending along the first direction;

a first memory cell electrically connected to and vertically between the bottom conductive line and the middle conductive line;

a second memory cell electrically connected to and vertically between the middle conductive line and the top conductive line; and a first via electrically connecting the first memory cell and the bottom conductive line.

17. The memory device of claim 16, wherein the first memory cell is in contact with the middle conductive line.

18. The memory device of claim 17, wherein the second memory cell is in contact with the top conductive line.

19. The memory device of claim 16, further comprising a second via electrically connecting the second memory cell and the middle conductive line.

20. The memory device of claim 16, wherein the first memory cell and the second memory cell are arranged along the second direction.

* * * * *